US010672765B2

(12) United States Patent
Price et al.

(10) Patent No.: US 10,672,765 B2
(45) Date of Patent: Jun. 2, 2020

(54) METHODS OF MANUFACTURING TRANSISTORS INCLUDING FORMING A DEPRESSION IN A SURFACE OF A COVERING OF RESIST MATERIAL

(71) Applicant: Pragmatic Printing Ltd, Sedgefield (GB)

(72) Inventors: Richard Price, Greater Manchester (GB); Scott White, Greater Manchester (GB)

(73) Assignee: National Centre For Printable Electronics, Sedgefield (GB)

( * ) Notice: Subject to any disclaimer, the term of this patent is extended or adjusted under 35 U.S.C. 154(b) by 0 days.

(21) Appl. No.: 15/236,057

(22) Filed: Aug. 12, 2016

(65) Prior Publication Data

US 2017/0125406 A1 May 4, 2017

Related U.S. Application Data

(63) Continuation of application No. 14/129,630, filed as application No. PCT/GB2012/051465 on Jun. 22, 2012, now Pat. No. 9,425,193.

(30) Foreign Application Priority Data

Jun. 27, 2011 (GB) .................................. 1110834.7
Feb. 14, 2012 (GB) .................................. 1202544.1
May 1, 2012 (GB) .................................. 1207599.0

(51) Int. Cl.
*H01L 27/088* (2006.01)
*G03F 7/00* (2006.01)
(Continued)

(52) U.S. Cl.
CPC .......... *H01L 27/088* (2013.01); *G03F 7/0002* (2013.01); *H01L 21/0272* (2013.01);
(Continued)

(58) Field of Classification Search
CPC ............... G03F 7/0002; H01L 27/1225; H01L 51/0516–0566; H01L 21/76817; B29C 2043/025; Y10S 977/887
See application file for complete search history.

(56) References Cited

U.S. PATENT DOCUMENTS 4,814,258 A * 3/1989 Tam ........................ G03F 7/094
430/156
5,173,442 A 12/1992 Carey
(Continued)

FOREIGN PATENT DOCUMENTS

EP        0684643 A1    11/1995
GB        2396734 A     6/2004
(Continued)

OTHER PUBLICATIONS

Austin, Michael D. et al., "Fabrication of 70 nm channel length polymer organic thin-film transitors using nanoimprint lithography", Applied Physics Letters, AIP, American Institute of Physics, Melville, NY, US, vol. 81, No. 23, Dec. 2, 2002, pp. 4431-4433.
(Continued)

*Primary Examiner* — Kevin Parendo

(57) ABSTRACT

A method of manufacturing a transistor comprising providing a substrate, a region of semiconductive material on the substrate, and a region of electrically conductive material on the region of semiconductive material; forming a covering of resist material over said regions; forming a depression in a surface of the covering of resist material that extends over a first portion of said region of conductive material, said first portion separating second and third portions of the conductive region; removing resist material located under said depression to form a window through said covering, exposing said first portion; removing said first portion to expose a connecting portion of the region of semiconductive material that connects the second and third portions; forming a
(Continued)

layer of dielectric material over the exposed connecting portion; and forming a layer of electrically conductive material over said layer of dielectric material.

16 Claims, 40 Drawing Sheets

(51) Int. Cl.
*H01L 29/786* (2006.01)
*H01L 51/05* (2006.01)
*H01L 27/12* (2006.01)
*H01L 29/66* (2006.01)
*H01L 21/027* (2006.01)
*H01L 21/768* (2006.01)
*H01L 21/28* (2006.01)
*H01L 21/283* (2006.01)
*H01L 21/311* (2006.01)
*H01L 21/8234* (2006.01)
*H01L 23/528* (2006.01)
*H01L 27/118* (2006.01)

(52) U.S. Cl.
CPC ...... *H01L 21/283* (2013.01); *H01L 21/28008* (2013.01); *H01L 21/31144* (2013.01); *H01L 21/76895* (2013.01); *H01L 21/823437* (2013.01); *H01L 21/823475* (2013.01); *H01L 23/528* (2013.01); *H01L 27/11803* (2013.01); *H01L 27/1214* (2013.01); *H01L 27/1288* (2013.01); *H01L 27/1292* (2013.01); *H01L 29/66757* (2013.01); *H01L 29/78666* (2013.01); *H01L 29/78675* (2013.01); *H01L 51/0541* (2013.01); *H01L 27/1225* (2013.01); *H01L 29/66969* (2013.01); *H01L 29/7869* (2013.01)

(56) References Cited

U.S. PATENT DOCUMENTS

| 6,380,009 | B1 | 4/2002 | Battersby |
| 2004/0023162 | A1 | 2/2004 | Hasegawa et al. |
| 2004/0187310 | A1 | 9/2004 | Gurumurthy |
| 2005/0266693 | A1* | 12/2005 | Maekawa ............. B82Y 10/00 438/720 |
| 2006/0221169 | A1 | 10/2006 | Holland |
| 2009/0159880 | A1 | 6/2009 | Honda et al. |
| 2009/0166612 | A1 | 7/2009 | Cain et al. |
| 2010/0079425 | A1* | 4/2010 | Yamazaki ........... H01L 27/1214 345/206 |
| 2010/0117071 | A1 | 5/2010 | Inoue et al. |
| 2010/0264410 | A1 | 10/2010 | Nomoto et al. |
| 2011/0042667 | A1 | 2/2011 | Kawmura et al. |
| 2012/0080658 | A1 | 4/2012 | Yang et al. |

FOREIGN PATENT DOCUMENTS

| GB | 2 421 115 A | 6/2006 |
| GB | 2479150 A | 10/2011 |
| JP | 60-167372 A | 8/1985 |
| JP | H02-62050 A | 3/1990 |
| JP | H04-75350 A | 3/1992 |
| JP | 2004-247716 A1 | 9/2004 |
| WO | WO 1996/36072 A | 11/1996 |
| WO | WO 2007/110671 A3 | 10/2007 |

OTHER PUBLICATIONS

Carlberg P. et al., "Lift-off process for nanoimprint lithography", Microelectronic Engineering, Elsevier Publishers Bv., Amsterdam, NL, vol. 67-68, Jun. 2003, pp. 203-207.

International Preliminary Search Report on Patentability and the Written Opinion of the International Searching Authory corresponding to International Application No. PCT/GB2012/051465, dated Jan. 16, 2014, 12 pages.

Jung, Ho et al., "Lift-off process using bilayer ultraviolet nanoimprint lithography and methacryloxypropyl-terminated-polydimethylsiloxane-based imprint resin", Journal of Vacuum Science and Technology B, AVS/AIP, Melville, Ny, US, vol. 27, no. 4, Jun. 24, 2009, pp. 1861-1864.

Pannemann, C. et al., "Nanometer scale organic thin film transistors with Pentacene", Microelectronic Engineering, Elsevier Publishing, Amsterdam, NL, vol. 67-68, Jun. 1, 2003, pp. 845-852; Abstract Only.

United Kingdom Search Report Corresponding to GB Application No. GB1207599.0; Date of Search: Aug. 28, 2012; 2 Pages.

United Kingdom Search Report Corresponding to GB Application No. GB1110834.7; Date of Search: Oct. 28, 2011; 2 Pages.

International Search Report and Written Opinion Corresponding to International Application No. PCT/GB2013/050337; dated May 14, 2013; 12 Pages.

\* cited by examiner

US 10,672,765 B2

METHODS OF MANUFACTURING TRANSISTORS INCLUDING FORMING A DEPRESSION IN A SURFACE OF A COVERING OF RESIST MATERIAL

RELATED APPLICATIONS

This application is a continuation of U.S. patent application Ser. No. 14/129,630, filed Dec. 27, 2013, which is a 35 U.S.C. § 371 national phase application of PCT Application No. PCT/GB2012/051465, filed Jun. 22, 2012 and published in English on Jan. 3, 2013 as International Publication No. WO 2013/001282, which claims priority to GB 1110834.7, filed Jun. 27, 2011; GB 1202544.1, filed Feb. 14, 2012; and GB 1207599.0, filed May 1, 2012, the entire contents of each of which is incorporated herein by reference.

FIELD OF THE INVENTION

The present invention relates to transistors, and in particular, although not exclusively, to thin film transistors.

BACKGROUND TO THE INVENTION

A wide variety of transistors are known. These include field effects transistors, in which the conductivity of a channel or layer of semiconductive material arranged between a source terminal and a drain terminal is controlled by application of a potential to a gate terminal. Thin-film transistors are also known. Thin film transistors (TFTs) are a type of field effect transistor (FET) typically made by depositing a thin film of a semiconductive active layer as well as a dielectric layer and metallic contacts over a supporting substrate. In certain applications, the substrate is glass, for example where the TFT is used in a liquid crystal display. TFTs can be made using a wide variety of semiconductive materials. By using transparent semiconductors and transparent electrodes, such as indium tin oxide (ITO), certain TFT devices can be made completely transparent.

In the manufacture of known TFTs, it is necessary to achieve alignment between the gate and source and drain terminals. In the past, lithographic techniques have been used to manufacture TFTs, with, typically, one mask defining the relative positions of source and drain terminals and another mask defining the positions of the gate terminals, for example where an array of a large number of TFTs is being produced. Clearly, a problem with such techniques is achieving the appropriate alignment between the finely patterned masks used at different stages of the manufacturing process. Another problem arises where the substrate has a large area and the array of TFT devices is to be distributed over that large area. Imperfections and distortions in the substrate can result in local misalignments between the source and drain and the gate of one or more TFT devices. In the manufacture of liquid crystal displays, for example, these misalignments can result in faulty pixels, which degrade the display and indeed may render it unacceptable.

Additional problems associated with the manufacture of thin-film transistors include the following. The minimum size of the device features is limited by the manufacturing techniques, which in turn limits the density of devices which can be formed on a single substrate, for example limiting the resolution of a display incorporating an array of TFTs. The correct operation of the thin film transistors is typically highly sensitive to the quality of the interfaces between the different device layers, such as the interface between the substrate and semiconductor material, the interface between the semiconductor material and the gate dielectric, and the interface between the gate dielectric and the gate electrode itself. These interfaces are degraded, and the performance of the TFT itself is degraded, when there are imperfections in these interfaces, such as when these interfaces become contaminated during the manufacturing process. It is therefore desirable to develop a method of manufacturing thin-film transistors which assists in the formation of clean, defect free interfaces.

SUMMARY OF THE INVENTION

Embodiments of the present invention aim to solve, at least partly, one or more of the problems associated with the prior art.

Particular embodiments aim to provide a method of manufacturing a transistor which facilitates correct alignment between the source, drain, and gate terminals.

Certain embodiments of the invention aim to provide methods of manufacturing transistors which are particularly suited to the manufacture of large-area devices, such as liquid crystal displays incorporating a large number of TFTs.

Certain embodiments aim to provide techniques of manufacturing transistors which are compatible with fast and high volume manufacturing of large-area devices.

Certain embodiments aim to provide transistors, and methods of manufacturing such transistors, having nanoscale features, i.e. features with dimensions in the range $10^{-9}$ to $10^{-7}$ m or even smaller.

According to a first aspect of the present invention there is provided a method of manufacturing a transistor, the method comprising:

providing a substrate, a region of semiconductive material supported by the substrate, and a region of electrically conductive material supported by the region of semiconductive material;

forming at least one layer of resist material over said regions to form a covering of resist material over said regions;

forming a depression in a surface of the covering of resist material, said depression extending over a first portion of said region of conductive material, said first portion separating a second portion of the conductive region from a third portion of the conductive region;

removing resist material located under said depression so as to form a window, through said covering, exposing said first portion of the electrically conductive region;

removing said first portion to expose a connecting portion of the region of semiconductive material, said connecting portion connecting the second portion to the third portion of the conductive region;

forming a layer of dielectric material over the exposed portion of the region of semiconductive material (e.g. by depositing dielectric material at least inside the window to form the layer of dielectric material over the exposed portion of the region of semiconductive material); and depositing electrically conductive material to form a layer of electrically conductive material over said layer of dielectric material, the layer of dielectric material electrically isolating the layer of electrically conductive material from the second and third portions of the conductive region, whereby said second and third portions provide a source terminal and a drain terminal respectively and the layer of electrically conductive material provides a gate terminal to which a potential may be applied to control a conductivity of the connecting portion of the region of semiconductive material connecting the second and third portions. In certain embodiments the method further comprises removing resist material at least from around said window so as to expose the second and third portions.

This method provides the substantial advantage that correct alignment of the source, drain, and gate terminals (and indeed the correct positioning of the semiconductor connecting portion, i.e. the channel, and gate dielectric) is achieved by the single step of forming the depression. In other words, the position of the depression formed in the covering of resist material defines, in a single step, the position of the source terminal, the position of the drain terminal, the position of the semiconductive channel connecting them, and the position of the gate relative to the semiconductor. In this way, alignment problems associated with the prior art are overcome.

It will be appreciated that the region of semiconductive material (which can also be described as an area or layer of semiconductive material) can be formed on the substrate using a wide range of known techniques. Any suitable known technique can therefore be employed to provide the region of semiconductive material in a method in accordance with the first aspect of the invention. Similarly, the region of conductive material (which can also be described as an area or layer of conductive material) can be formed on the semiconductive region using a wide range of known techniques. Any suitable known technique can therefore be employed to provide the region of conductive material in a method in accordance with the first aspect of the invention.

A wide variety of materials may be used for the substrate, which in certain embodiments may be transparent, and in others opaque. In certain embodiments the substrate consists of a single layer or body of substrate material. In certain embodiments the substrate has a multi-component (e.g. multi-layer) structure, comprising a plurality of different substrate materials.

In certain embodiments the substrate comprises at least one material (e.g. in the form of a layer of that material) selected from a list comprising: glass (rigid or flexible); polymer (e.g. polyethylene naphthalate or polyethylene terephthalate); polymeric foil; paper; insulator coated metal (e.g. coated stainless-steel); cellulose; polymethyl methacrylate; polycarbonate, polyvinylalcohol; polyvinyl acetate; polyvinyl pyrrolidone; polyvinylphenol; polyvinyl chloride; polystyrene; polyethylene naphthalate; polyethylene terephthalate; polyamide (e.g. Nylon); poly(hydroxyether); polyurethane; polycarbonate; polysulfone; polyarylate; acrylonitrile butadiene styrene, 1-Methoxy-2-propyl acetate (SU-8), polyhydroxybenzyl silsesquioxane (HSQ), polyimide, Benzocyclobutene (BCB), $Al_2O_3$, $SiO_xN_y$, $SiO_2$, $Si_3N_4$; UV-curable resin; Nanoimprint resist; photoresist.

In certain embodiments the substrate may be a multi-component system in which the first conductive layer has embedded conductive structures within one or more of the components. The multi-component system may include a release layer, releasable by methods such as UV, thermal, laser or physical peeling, which enables one or more of the components to be detached from the other components. Such detachment may be used to expose or enable easier exposure of the embedded conductive structures connected to the first conductive layer. In certain embodiments the substrate may comprise one or more embedded/incorporated features and/or devices. For example, the substrate may comprise a plurality of conductive tracks to provide connections to, and interconnections between, one or more transistors formed on the substrate.

A wide variety of techniques may also be used to form the at least one layer of resist material, and a variety of resist materials may be employed in different embodiments of the invention. These methods of forming the at least one layer of resist material include coating (spin, dip, blade, bar, spray, slot-die) or extrusion. Suitable resist materials include poly hydroxybutyrate, polymethyl methacrylate, polyvinylalcohol, polyvinyl acetate, polyvinyl pyrrolidone, polyvinylphenol, polyvinyl chloride, polystyrene, polyamide (e.g. Nylon), poly(hydroxyether), polyurethane, polycarbonate, polysulfone, polyarylate, acrylonitrile butadiene styrene, polyimide, benzocyclobutene (BCB), photoresist, 1-Methoxy-2-propyl acetate (SU-8), polyhydroxybenzyl silsesquioxane (HSQ), fluorinated polymers e.g. PTFE, uv curable liquid resin (such as those described in U.S. Pat. No. 6,284,072), silicone, silioxane, parylene. Commercial imprint resists are available through companies such as Microchem/Microresist, Shipley and Nanolithosolution Inc.

A variety of techniques may be employed for forming the depression in a surface (e.g. a nominal upper surface) of the covering of resist material. One suitable technique is to employ a mask to define the location of the depression, and then to remove material to form a depression. Another technique which is used in certain embodiments of the invention is to form the depression using an imprint tool, which may also be referred to as an imprint stamp or shim. This imprint tool typically will have an imprint feature protruding from a base surface, the imprint tool being positioned with respect to the covering of resist material so that the imprint feature is correctly located over the first portion. The depression may be formed by pressing the imprint tool against the covering after the covering has been formed. Alternatively, in other embodiments the depression may be formed by imprinting the resist material at the same time as the covering, or at least an upper layer of it, is formed.

In certain embodiments the covering comprises just a single layer of resist material. However, in alternative embodiments the covering comprises a plurality of layers. In certain embodiments, the covering comprises a first layer of a first resist material, and a second layer of a second, different resist material, formed over the first layer. In certain embodiments, the first resist material is a lift-off resist material, such as Microchem LOR or AR-ULP underlayer polymer (Nanolithosolution Inc). In certain embodiments, the second resist material is an imprintable resist material. Thus, in certain embodiments, the depression can be formed in a surface of a second layer of imprintable resist material at the same time that the second layer is formed. For example, the second resist material may be a UV curable polymer and the imprint tool or mask may be transparent to UV such that the resist material can be cured while the imprint mask is in contact with it, thereby defining the depression.

The removing of the first portion of conductive material can be achieved using a variety of techniques. These techniques include ablation (e.g. laser) and etching (chemical, dry, reactive-ion, plasma).

A wide variety of semiconductive materials may be used in embodiments of the invention, including for example: metal oxides such as zinc oxide, tin oxide, cuprous oxide; inorganic semiconductor such as amorphous, microcrystalline or nanocrystalline silicon; binary metal oxides such as lithium zinc oxide, zinc tin oxide, indium tin oxide, indium zinc oxide; ternary metal oxides such as GaInZnO; metal oxynitrides e.g. $Zn_xO_yN_z$; organic or polymer semiconductors.

The depositing of dielectric material can be performed using a variety of techniques, including: vapour deposition (physical e.g. sputter; chemical e.g. PECVD); vacuum deposition (e.g. thermal or e-beam evaporation); coating e.g. spray, spin, slot, die; printing e.g. jet; pulsed-laser deposition (PLD); atomic-layer deposition (ALD).

It will be appreciated that, in certain embodiments of the invention, the deposition techniques result in dielectric material being deposited additionally outside the window, that is on top of the covering of resist material in which the window is defined. It will also be appreciated that dielectric material deposited outside the window, on top of the covering of resist material, is removed in the later step of the method when resist material, round the window, is removed.

Dielectric materials suitable for use in embodiments of the invention include the following: polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate, parylene, SU8, Cytop; inorganic insulator such as silica, silicon nitride, metal oxide (e.g. $Al_2O_3$, $HfO_2$, $TiO_2$, $Ta_2O_5$, $Y_2O_5$, $ZrO_2$), metal phosphates (e.g. $Al_2PO_x$), metal sulphates/sulfites (e.g. $HfSO_x$), metal oxynitrides (e.g. $AlO_xN_y$), metal nitride (AlN), silicone, silioxane, $SiN_x$ The depositing of electrically conductive material can be achieved using a variety of techniques, including: vapour deposition (physical e.g. sputter; chemical e.g. PECVD); vacuum deposition (e.g. thermal or e-beam evaporation); coating e.g. spray, spin, slot, die; printing e.g. jet; pulsed-laser deposition (PLD); atomic-layer deposition (ALD).

A wide range of materials can be used as the electrically conductive material, including for example: metal (e.g. Au, Ag, Ti, Al, Cr, Ni, Cu, Ta, W, Pt, Mo etc.), transparent conductive oxide (e.g. ITO, AZO, IZO), carbon black, carbon nanotubes, conducting polymer (e.g. polyaniline, PEDOT:PSS)

Again, in certain embodiments of the invention this deposition of electrically conductive material will also result in conductive material being deposited on top of dielectric material itself overlaying resist material, outside the window. Thus, the method in certain embodiments results in a multi-layer structure being built up directly on the connecting portion of semiconductor material (the channel) inside the window, and a corresponding multi-layer structure being built up on top of the covering of resist material outside the window. The multilayer structure built up on the covering of resist is typically completely removed at a later stage, leaving just the multi-layer structure that was formed in the window to form part of the eventual transistor.

The resist in certain embodiments can be selected so as to discourage or repel growth of one or more thin-films, i.e. of dielectric or conductive material, on the resist during the deposition process. The resist in certain embodiments can additionally be chemically modified to change its surface properties, for example with a fluorinated silane or other fluorinated coating, or formulated so as to make the surface substantially hydrophobic or hydrophilic or lyophobic. An alternative chemical treatment as described in EP1124791 or U.S. Pat. No. 7,034,129, the contents of which are incorporated by reference herein, may also be applied to change the surface hydrophobicity. Additional surface treatment such as UV, plasma, ozone, corona discharge or piranha etch may also be applied. The choice will depend on the materials to be deposited and the selectivity of the deposited layer to the surface treatment.

The removing of resist material at least from around the window can be achieved using a variety of techniques, including: development with lift-off remover (e.g. Microchem nanoremover PG), solvent (e.g. organic, aqueous), ozone (e.g. ozonated water); planarization and milling (e.g. ion)/grinding (e.g. chemical, physical)/etching (e.g. dry, wet, reactive-ion); or a combination of one or more of the previous techniques.

In embodiments where the covering of resist material comprises just lift-off resist material, or a bottom layer of lift-off resist material, this removing step can also be referred to as a lift-off step.

In certain embodiments, the method may further comprise undercutting (i.e. forming at least one undercut in) the covering of resist material around the window before said depositing of dielectric material so as to expose a part of an upper surface of the second portion adjacent the connecting portion of semiconductor and expose a part of an upper surface of the third portion adjacent the connecting portion.

This provides the advantage that the deposition of the dielectric material inside the window can be arranged such that the dielectric layer covering the semiconductive channel partially overlaps or overlies those parts of the second and third portions of conductive material, and so provides better electrical insulation/isolation between the gate terminal (subsequently formed on the dielectric later) and the channel and source and drain terminals than could be achieved if edges of the dielectric layer coincided with the edges of the source and drain regions.

In certain embodiments, the undercutting around the window is achieved by selecting first and second layers of resist material having different properties, and then preferentially removing material of the underlying layer. For example, the different resist materials may be selected so as to have different etch rates for a given etching material or process, the etching rate of the lower layer being greater than that of the upper layer or layers.

In addition to employing undercutting, the window may also generally be widened before the dielectric material is deposited, so as to expose even greater areas of the source and drain regions. This widening may be performed at the same time as the undercutting, after the undercutting, or, in certain embodiments, as an alternative to undercutting. By exposing even greater portions of the second and third regions (i.e. the source and drain regions) the dielectric layer can be formed in a manner so as to provide better isolation to those regions.

It will be appreciated that a substantial advantage of employing undercutting in certain embodiments of the invention is that, as the dielectric and conductive layers are sequentially deposited (i.e. built up) inside the window, the associated build up of dielectric and conductive material on the overhanging lip or rim of the window may result in the areas of the layers becoming progressively smaller inside the window region. This helps to ensure that the gate material does not form a short to the source and/or drain regions, and furthermore ensures that the layer of dielectric material completely insulates the gate layer from the semiconductive layer. The formation of the undercut or undercuts also helps to maintain a break between the layers of materials deposited inside the window and the corresponding layers of materials deposited on top of the covering of resist material surrounding the window. In turn, this facilitates the final removal or lift-off step, whereby the "unwanted" dielectric and conductive material is removed, leaving just the desired multi-layer structure arranged with respect to the source and drain terminals.

In certain embodiments the imprinting tool comprises a plurality of imprint features each raised a respective height above a base surface of the imprinting tool.

In certain embodiments the plurality of imprint features comprises a first imprint feature (403) raised a first height (h3) above the base surface, and forming said depression comprises forming the depression with the first imprint feature, such that the depression initially has a depth substantially equal to the first height.

In certain embodiments the plurality of imprint features comprises a second imprint feature (402) raised a second height (h2) above the base surface, the second height being greater than the first height, and the second imprint feature being arranged to define a perimeter of the transistor, and the method further comprising using the second imprint feature to form a second depression in the surface of the covering of resist material, said second depression extending around the first, second, and third portions of said region of conductive material.

In certain embodiments the imprint tool comprises first and second base regions (401) arranged inside the second imprint feature and separated by the first imprint feature, the base regions defining the positions of the second and third portions of the layer of conductive material.

In certain embodiments the method further comprises:
removing resist material located under the second depression so as to form a second window, through said covering, exposing a perimeter portion of the electrically conductive region surrounding the first, second, and third portions of the region of conductive material;
removing the perimeter portion of the electrically conductive region to expose an underlying perimeter portion of the region of semiconductive material; and
removing the perimeter portion of the region of semiconductive material to expose an underlying perimeter portion of the substrate, whereby the perimeter portion of the substrate surrounds the transistor.

In certain embodiments the method further comprises:
forming a covering layer of dielectric material to cover said underlying perimeter portion of the substrate, said second and third portions of the region of electrically conductive material, and said connecting portion;
forming a layer of photoresist material over said covering layer;
exposing the layer of photoresist material to radiation from a radiation source such that the second and third portions of the region of electrically conductive material at least partially shield first and second portions of the layer of photoresist material, located above the second and third portions of the region of electrically conductive material respectively, from said radiation;
developing the layer of photoresist material to remove said first and second portions of the layer of photoresist material to expose underlying portions of the covering layer of dielectric material; and
removing said underlying portions of the covering layer to expose parts of the second and third portions of the region of electrically conductive material, whereby electrical connections can be made to the exposed parts, through the covering layer.

In certain embodiments the method further comprises removing remaining photoresist material after exposing said parts.

In certain embodiments, said removing remaining photoresist material exposes a channel covering portion of the covering layer, the channel covering portion covering at least said connecting portion, and the method further comprises forming a gate terminal on the channel covering portion.

In certain embodiments the method further comprises:
forming undercuts in walls of the resist material defining the first and second windows;
depositing dielectric material at least inside the first and second windows to cover at least the underlying perimeter portion of the substrate and said connecting portion; and
removing resist material to expose at least parts of the second and third portions of the region of electrically conductive material.

In certain embodiments the method further comprises forming a gate terminal on the dielectric material covering said connecting portion.

Another aspect of the invention provides a method of forming an electrical circuit comprising a plurality of transistors, the method comprising: forming each said transistor on a common substrate using a method in accordance with the above-mentioned first aspect; and forming interconnections between these transistors.

Another aspect of the invention provides a transistor manufactured using a method in accordance with any aspect of the invention. Another aspect of the invention provides an electrical circuit manufactured using a method embodying the invention.

Further aspects of the invention provide: an electronic circuit or logic gate comprising at least one transistor embodying the invention;
a programmable transistor array comprising a plurality of transistors, each manufactured by a method embodying the invention, and having been formed on a common substrate; and
a programmable logic array comprising a plurality of logic gates, each logic gate comprising at least one respective transistor manufactured by a method embodying the invention, and wherein the respective transistors are formed on a common substrate.

In certain embodiments, the array further comprises a covering of dielectric material formed over the plurality of transistors formed on the common substrate.

In certain embodiments, the array further comprises a plurality of windows formed in the covering of dielectric material to expose a plurality of terminals of the plurality of transistors so as to enable selected interconnections to be made between the exposed terminals.

Another aspect provides an electronic circuit comprising an array in accordance with one of the above-mentioned aspects, and a plurality of electrical tracks arranged to provide interconnections between selected transistor terminals.

Another aspect provides a method of forming an electronic circuit, the method comprising manufacturing an array of a plurality of transistors on a common substrate using a method in accordance with any other aspect, forming a covering of dielectric material over the array of transistors, forming a plurality of windows in the covering of dielectric material, each window exposing at least a portion of a terminal of a respective transistor, and selectively forming interconnections between said exposed portions of terminals. In certain embodiments, the selective formation of interconnections comprises printing conductive material. Another aspect provides an electronic circuit manufactured using this method.

Another aspect of the invention provides a regular array of transistors or logic gates which can be programmed to create a particular electrical circuit, such that the fabrication of the regular array is the same for each circuit but different functionalities can be chosen through programming. The programming can be achieved by designing a mask, such as a photomask, to selectively open up certain terminals (source, drain, gate, voltage rail, etc.) to create a particular circuit. Alternatively, a standard mask may be used, such as an imprint tool with regular features or a photomask, which opens-up all the possible terminals available for programming. The circuit can then be selected by depositing conductive material, e.g. by jet-printing of conductive ink such as nanoparticulate silver, into the desired terminals to create the functional circuit required. An alternative method uses laser-writing or maskless lithography to create windows in a resist material and in-filling the windows with conductive material. In this case the resist may be used as a lift-off mask to remove unwanted conductive material or a solution-based infill may equally be employed.

A further method provides via-holes over the terminals areas, either by selective drilling (e.g. micro, laser) of the desired vias for the circuit or by opening-up every available programmable terminal. In the first case conductive material may be used to fill-in the vies (e.g. evaporation, solvent deposition, sputter-coating) which may be connected together by printing, e.g. jet, gravure, etc. In the second case the vias may be created by a regular imprint tool or photomask or by drilling (e.g. micro, laser). All the vias may be filled with conductive material using solution deposition, vacuum, vapour deposition, coating or electroplating/electroless plating up from the conductive material on the terminal. Chemical vapour deposition is also possible, for example Cupraselect™, a commercial material available from Air Products, may be used to selectively deposit copper onto conductive areas leaving insulating areas uncoated. This may equally be employed to fill-in via-holes. Again, the via-holes may be used to program or select a circuit for a particular application using printing methods such as gravure, jet or flexo, amongst others. Alternatively a multi-level imprint such as described in GB915250.5 may be used to create a standard array of potential interconnections between terminals of the regular transistor or logic array. The imprinted structure may then be filled with conductive material to create all possible interconnections. The final step of programming may be to disconnect undesired interconnections for example using fuse-burning or laser-ablation of undesired interconnection wires. Other programming and interconnection methods are described in GB920563.4, and GB915250.5, the contents of each of which are incorporated by reference herein.

Another aspect of the invention provides a transistor comprising:
 a substrate;
 a region of semiconductive material supported by the substrate;
 a source terminal and a drain terminal, each said terminal being supported by the region of semiconductive material, and the source and drain terminal being connected by a connecting portion of the region of semiconductive material;
 a layer of dielectric material deposited so as to cover at least a portion of said connecting portion; and
 a layer of electrically conductive material deposited so as to cover at least a portion of the layer of dielectric material, the layer of dielectric material electrically isolating the layer of conductive material from the source and drain terminals, and the layer of electrically conductive material providing a gate terminal to which a potential may be applied to control a conductivity of the connecting portion of the region of semiconductive material connecting the source and drain terminals.

It will be appreciated that further advantages provided by embodiments of the invention include the following. Certain embodiments of the invention provide methods which are capable of producing transistors (i.e. switching devices) having nanoscale dimensions, and devices (e.g. logic gates) and circuits incorporating such nanoscale transistors. Certain embodiments are able to provide manufacturing methods which themselves provide a pathway to smaller device features beyond photolithographic techniques. Certain embodiments provide methods in which a sequence or series of the method steps to manufacture transistors may be performed without breaking vacuum, thereby providing the advantage that the cleanliness and integrity of interfaces between different materials is maintained. For example, rf magnetron coating may be used to successively deposit layers of aluminium oxide (dielectric) and indium tin oxide (gate electrode).

BRIEF DESCRIPTION OF THE DRAWINGS

Embodiments of the invention will now be described with reference to the accompanying drawings, of which.

DETAILED DESCRIPTION OF EMBODIMENTS OF THE INVENTION

Figure 1A:
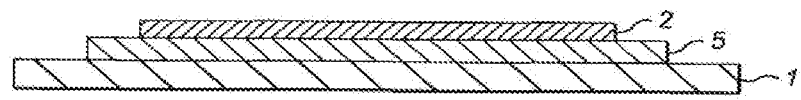
FIGS. 1A, 1B, 1C, 1D, 1E, 1F, and 1G are schematic representations of steps in a method of manufacturing a transistor embodying the present invention.

Referring now to FIGS. 1A, 1B, 1C, 1D, 1E, 1F, and 1G, this illustrates stages or steps in a first method embodying the invention for manufacturing a transistor, which may be referred to as a thin film transistor. The method comprises a step of providing a substrate 1, a region of semiconductive (i.e. semiconductor) material 5 supported by the substrate, and a region of electrically conductive material 2 supported by the semiconductor 5. The resultant arrangement is shown in FIG. 1A. Here, the region 5 can also be described as a layer of semiconductive material, or a pad. In this embodiment, the region 5 does not cover the entire upper surface of the substrate 1, but just a selected portion of it. It will be appreciated that, although FIGS. 1A, 1B, 1C, 1D, 1E, 1F, and 1G show the formation of just a single transistor including source and drain regions formed from a single pad or region 5, in alternative embodiments an array of a plurality of transistors may be formed on a common substrate 1, each transistor being formed to incorporate source and drain regions from a respective one of a plurality of pads. It will also be appreciated that the semiconductive region 5 and conductive region 2 shown in FIG. 1A may be formed on the substrate surface using a variety of techniques known in the art.

Figure 1B:
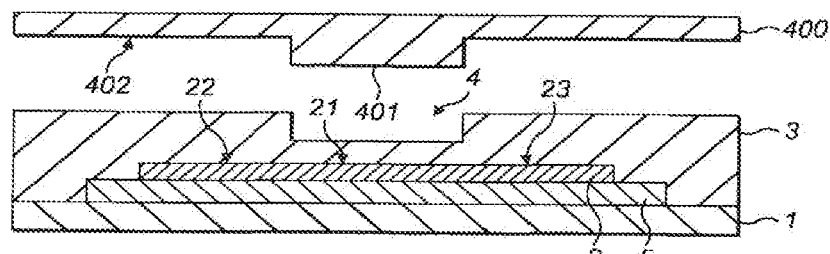

After providing the semiconductive and conductive regions 5 and 2 on the substrate 1, a covering 3 of resist material is formed over the regions 5 and 2, to encapsulate them, and a depression 4 is formed in a surface 34 of the covering 3. In this first embodiment, the depression 4 is formed at the same time as the covering 3 of resist material is formed, and the resist material of the covering 3 is a UV curable polymer. The depression 4 has been formed by using an imprint tool 400, having an imprint feature 401 raised above a base surface 402. The resist covering 3 has been formed with the imprint tool 400 positioned with respect to the substrate and semiconductive and conductive regions 5, 2 and the resist material 3 has then been cured by application of UV light through the imprint tool or mask 400 (which is transparent to UV). The imprint tool 400 has then been separated from the structure, as shown in FIG. 1B. The depression 4 extends over a first portion 21 of the conductive region 2, and this first portion 21 separates a second portion 22 from a third portion 23 of the region 2. The second portion 22 will form the source of the transistor, and the third portion 23 will form the drain.

Figure 1C:
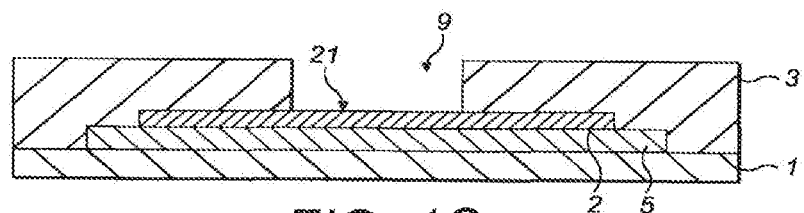
Figure 1D:
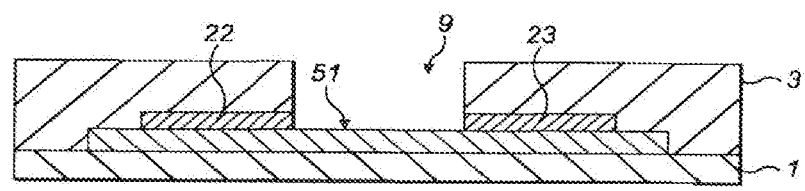

After forming the resist covering 3 and depression 4, resist material located under the depression 4 is then removed by a suitable technique (e.g. etching) to form a window 9 through the covering 3 and which exposes the first portion 21 of the region 2. The resultant arrangement is shown in FIG. 1C. Next, this first portion 21 of conductive material is also removed, such that the window 9 now extends through the covering 3 and the conductive region or pad 2, to a surface of the semiconductor layer 5 as shown in FIG. 1D. Thus, a portion 51 of the semiconductor layer is exposed, this exposed portion 51 connecting the source and drain regions 22, 23. Thus, the window 9 defines a gap between the source and drain, above the connecting semiconductor channel 51.

Figure 1E:
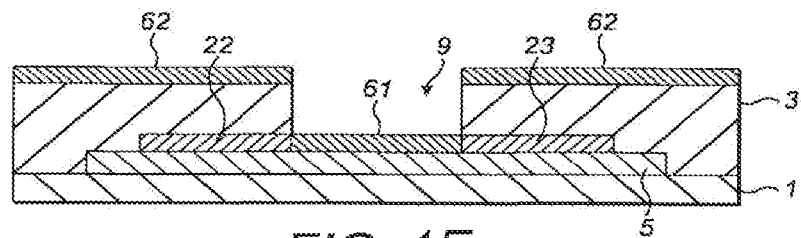

Next, dielectric material is deposited over the structure shown in FIG. 1D, to produce the structure shown in FIG. 1E. This dielectric material has formed a layer of dielectric material 61 (a gate dielectric layer) inside the window 9 and which covers the connecting portion 51. The deposited dielectric material has also formed layers or coatings/coverings 62 on top of the resist material around the window.

Figure 1F:
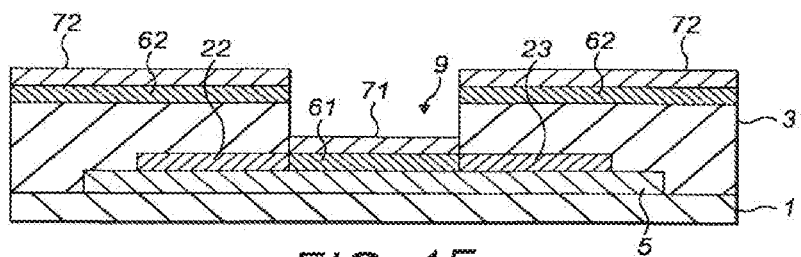
Figure 1G:
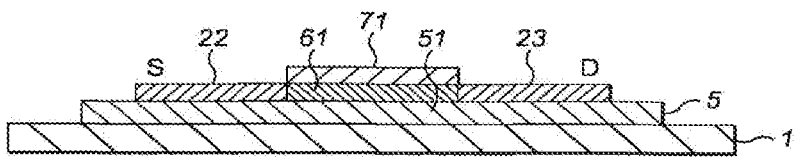

Next, electrically conductive material is deposited on the structure shown in FIG. 1E, to produce the structure of FIG. 1F. This deposited electrically conductive material forms a layer of electrically conductive material 71 on top of the semiconductor 51 and dielectric 61 layers inside the window 9, and again forms corresponding layers 72 of conductive material on top of the layers 62 overlaying the resist covering around the window. Thus, both inside the window 9 and on top of the resist covering around the window, a two-layer structure or stack is formed, comprising a bottom layer of dielectric, and a top layer of conductive material.

Next, the remaining resist material of the covering 3 is removed from the substrate by a suitable technique. By removing the resist material around the window 9, the surrounding layers 62 and 72 are also lifted off the structure, to leave the structure shown in FIG. 1G. As will be appreciated, this structure comprises a transistor having a source, drain, and connecting conductive channel 51 supported on a surface of the substrate 1. A gate terminal 71 is separated from the semiconductor layer 51 by a gate dielectric 61, and application of a potential to the gate is able to control conductivity of the semiconductive channel 51 between the source and drain.

In this first embodiment, the thickness of the layer of semiconductive material 51 is substantially equal to the thickness of the source and drain terminals 22, 23, although it will be appreciated that in other embodiments the relative thicknesses may be different, for example the semiconductive layer 51 may be thicker than, or thinner than the source and drain regions.

Referring now to FIGS. 2A, 2B, 2C, 2D, 2E, and 2F, this shows another method embodying the invention, for manufacturing a field effect transistor. In this second embodiment, regions or pads 5 and 2 of semiconductive and electrically conductive material are again formed on a substrate 1. For simplicity, FIGS. 2A, 2B, 2C, 2D, 2E, and 2F only show the portion of substrate 1 underneath the semiconductive 5 and conductive 2 regions, and it will be appreciated that in certain embodiments the semiconductive and conductive regions 5, 2 will not cover the entire substrate 1, instead covering just a portion of it. In this second embodiment, a covering 3 of resist material is again formed over the regions 5 and 2, but this time the covering 3 comprises a first layer 31 of lift-off resist material formed directly over the conductive region 2, and a second layer 32 of imprintable resist material formed over the first layer 31. Thus, the resist covering 3 comprises layers of different resist materials, having different properties.

In this second embodiment, after forming the resist covering 3, a depression 4 is formed in an upper surface 34 of the top layer 32 of imprintable resist material. In alternative embodiments, the depression 4 may be formed at the same time as forming the upper layer 32 of resist material. For example, in certain embodiments the semiconductor region 5 and conductive region 2 may together be one of a plurality of multi-layer pads deposited onto the substrate 1 at selected positions using a first mask. Over that structure, a layer of lift-off resist material can be formed by spin-coating. Then, an imprint tool, which can be regarded as a second mask, can be aligned with respect to the pads 5, 2 and the second layer 32 of resist material, incorporating the depression or depressions 4 can be formed with the second mask in position over the pads. As described above, the material for the upper layer 32 of resist can be UV curable material.

Still referring to FIGS. 2A, 2B, 2C, 2D, 2E, and 2F, this illustrates stages or steps in a method embodying the invention for manufacturing a transistor, which may be referred to as a thin film transistor. The method comprises a step of providing a region of electrically conductive material 2 and a region of semiconductor material 5 (optionally supported by a substrate 1 (not shown)). Layer 2 may have been formed, for example, by doping the upper portion of a region of the semiconductor material 5, for example using plasma treatment, thermal, pulsed-lamp or laser annealing, or deposition of a strongly polar material (e.g. self-assembled monolayer) capable of modulating carrier density within the film.

Figure 2A:
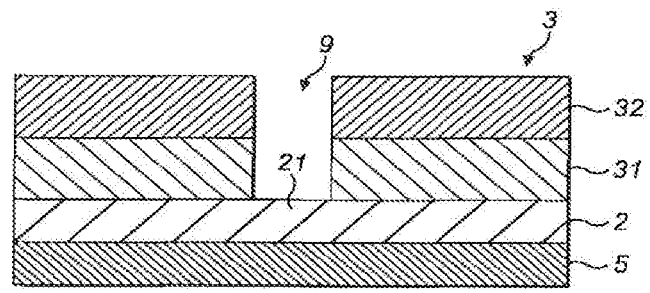
FIGS. 2A, 2B, 2C, 2D, 2E, and 2F are schematic representations of steps in another method embodying the invention and for manufacturing a transistor.

After providing the conductive region 2 on the region of semiconductor material 5, a covering of lift-off resist material 31 and UV curable polymer 32 is deposited over the entire substrate. A window 9 is created through patterning of the layers 31 and 32, such as UV imprint, followed by removal of the residual material so as to expose the top-surface of region 21 of conductive layer 2, and optionally portions of the top surface of the substrate (e.g. surrounding the device). The resultant arrangement is shown in FIG. 2A.

Figure 2B:
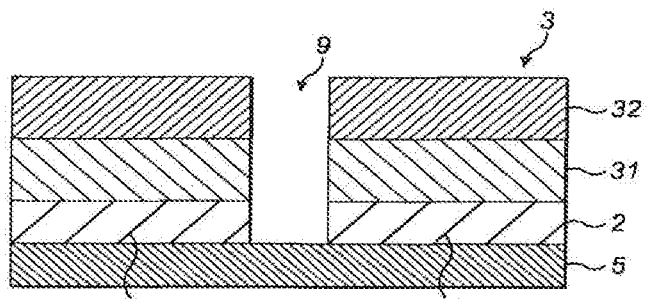

FIG. 2B shows a further stage where the exposed area 21 of conductive material 2 is completely removed so as to create separate regions of conductive material 22 and 23, which will later become the source and drain regions of the thin-film transistor.

Figure 2C:
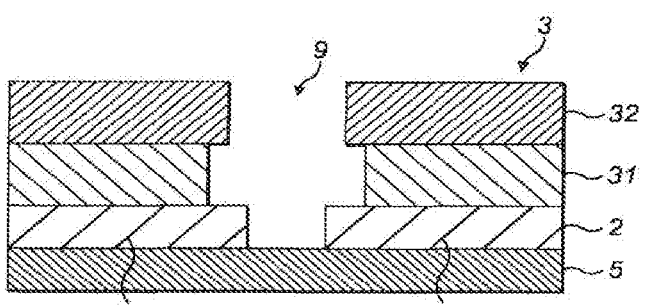

FIG. 2C shows a further stage where the window 9 is widened, for example by oxygen plasma, removing portions of lift-off resist 31 and UV curable polymer 32. In this case the lift-off resist is widened more quickly than the UV curable polymer 32, creating a lip or undercut structure.

Figure 2D:
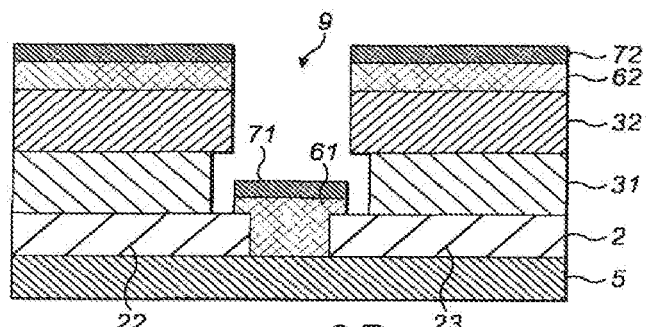

Next, dielectric material and conductive material is deposited over the structure shown in FIG. 2C, to produce the structure shown in FIG. 2D. The dielectric material has formed a layer of dielectric material 61 inside the window 9 which mechanically, but not electrically, connects the first conductive region 22 to the second conductive portion 23. The deposited dielectric material has also formed layers or coatings/coverings 62 on top of the resist material around the window. The conductive material has formed a layer of conductive material 71 inside the window 9 and sits on top of the dielectric material 61. The deposited conductive material has also formed layers or coatings/coverings 72 on top of the resist material around the window 9.

Figure 2E:
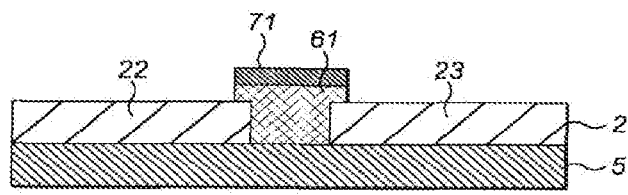
Figure 2F:
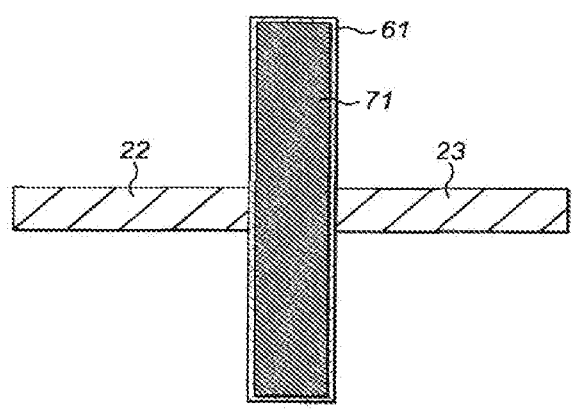

Next the lift-off resist 31 is removed using solvent developer, in the same process removing the remaining UV curable polymer 32 and regions of dielectric material 62 and conductive material 72. The resulting structure is a thin-film transistor as shown in FIG. 2E. FIG. 2F shows a top-view of the thin-film transistor structure. Optional supporting substrate 1 is also labelled. In this device the semiconductive channel between the source and drain is provided in the layer of semiconductive material 5. The source and drain terminals 22 and 23 are positioned above the semiconductive layer 5, the gate dielectric 61 separates the source and drain in their plane, and extends above that plane, and the gate terminal 71 sits above the planes of both the channel and the source and drain terminals.

Referring now to FIGS. 3A, 3B, 3C, 3D, 3E, and 3F, this illustrates stages or steps in another method embodying the invention for manufacturing a transistor, which may be referred to as a thin film transistor. The method comprises a step of providing a region of electrically conductive material 2, a region of semiconductor material 5 and layer of dielectric material 8, optionally supported by a substrate 1 (not shown).

Figure 3A:
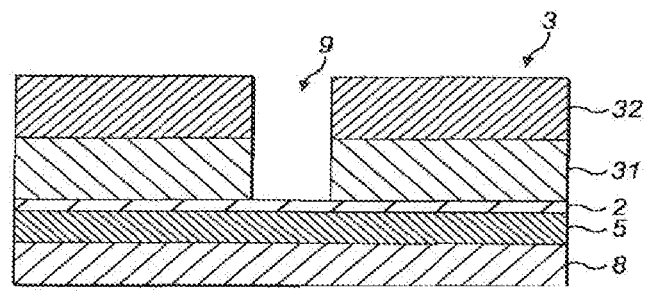
FIGS. 3A, 3B, 3C, 3D, 3E, and 3F are schematic representation of steps in another method of manufacturing a transistor embodying the invention.

After providing the conductive region 2 on the region of semiconductor material 5 and layer of dielectric material 8, a covering of lift-off resist material 31 and UV curable polymer 32 is deposited over the entire substrate. A window 9 is created through patterning of the layers 31 and 32, such as UV imprint, followed by removal of the residual material so as to expose region 21 of conductive layer 2 and optionally the top surface of the substrate 1. The resultant arrangement is shown in FIG. 3A.

Figure 3B:
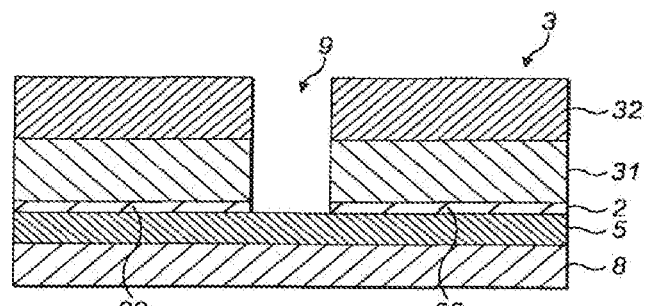

FIG. 3B shows a further stage where the exposed area 21 of conductive material 2 is completely removed so as to create separate regions of conductive material 22 and 23, which will later become the source and drain regions of the thin-film transistor.

Figure 3C:
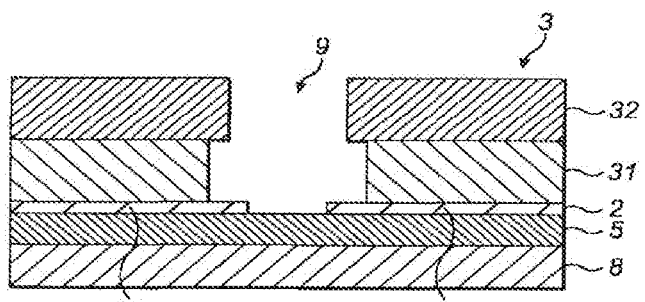

FIG. 3C shows a further stage where exposed portions of the lift-off resist 31 are removed using a developer, leaving UV curable polymer 32 and thus the width of window 9 unaffected. Similar to FIG. 2C a lip or undercut structure has been created.

Figure 3D:
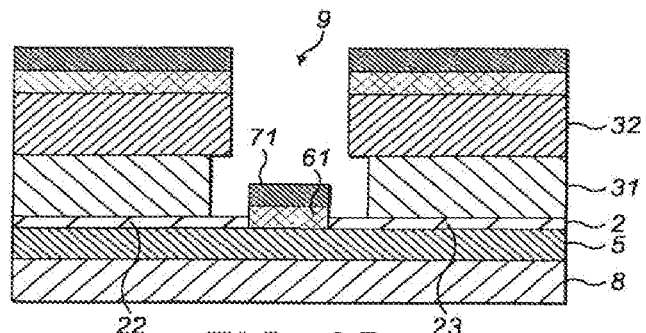

Next, dielectric material and conductive material are deposited over the structure shown in FIG. 3C, to produce the structure shown in FIG. 3D. The dielectric material has formed a layer of dielectric material 61 inside the window 9 which connects the first conductive region 22 to the second conductive portion 23. The deposited dielectric material has also formed layers or coatings/coverings 62 on top of the resist material around the window. The conductive material has formed a layer of conductive material 71 inside the window 9 and sits exactly aligned to the previously deposited dielectric material 61. The deposited conductive material has also formed layers or coatings/coverings 72 on top of the resist material around the window 9.

Figure 3E:
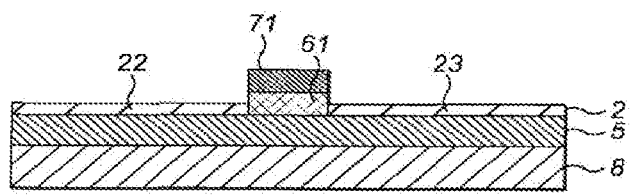
Figure 3F:
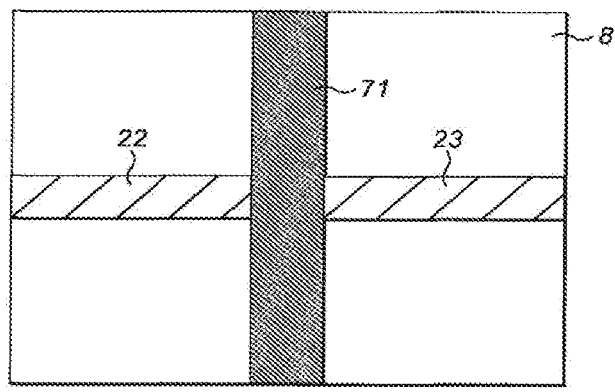

Next the lift-off resist 31 is removed using solvent developer, in the same process removing the remaining UV curable polymer 32 and regions of dielectric material 62 and conductive material 72. The resulting structure is a thin-film transistor as shown in FIG. 3E. FIG. 3F shows a top-view of the thin-film transistor structure.

Referring now to FIG. 4 this illustrates stages or steps in another method embodying the invention for manufacturing a gate or circuit, which may be referred to as a thin film gate or circuit. The method comprises a step of providing regions of electrically conductive material 2 and 220, a region of semiconductor material 5 and a layer of dielectric material 8, optionally supported by a substrate 1 (not shown).

A layer of lift-off resist 31 and a layer of UV curable polymer 32 have been deposited over conductive region 2. The layers 31 and 32 have been patterned with an imprint tool 400 as shown in FIG. 4E. The imprint tool 400 (which is transparent to UV) has imprint features 401 and 403 raised at different heights above a base surface 402. The lift-off resist covering 31 and UV curable polymer 32 have been patterned (by urging imprint tool 400, exposing to UV light and removing imprint tool 400) to create different height features relating to 401 and 403.

Figure 4A:
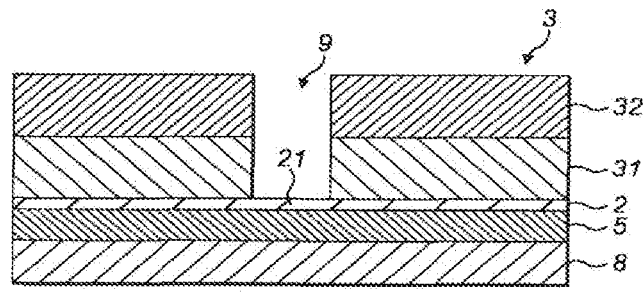
FIGS. 4A, 4B, 4C, 4D, 4E, 4F, 4G, 4H, 4I, 4J, 4K, and 4L are schematic representations of steps in a method of manufacturing a gate or circuit in accordance with an embodiment of the invention.

FIG. 4A shows a section of the structure relating to imprint tool height 403. Layers 31 and 32 has been etched by oxygen plasma so as to removed to expose the top-surface 21 of conductive layer 2 and create window 9.

Figure 4B:
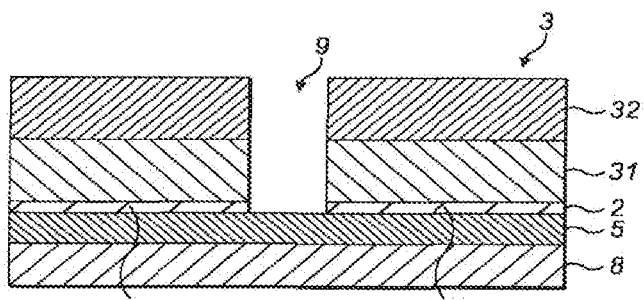

FIG. 4B shows a further step where exposed conductive material 21 has been completely removed.

Figure 4C:
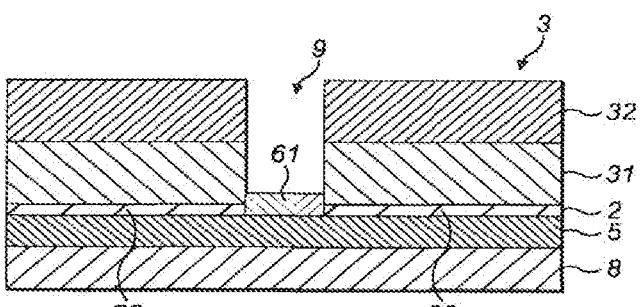

FIG. 4C shows a further step where a layer of dielectric material 61 has been deposited within the window 9. The deposition process is such that this only occurs within the window 9. For example, this can be deposited by solution filling the lowest point in the trench 9. Alternatively, a selective deposition process such as atomic layer deposition may have been used. In this instance the resist materials 31 and 32 would have properties which repel adhesion of the dielectric, e.g. very hydrophobic, perfluorinated materials. They may have been treated with a surface coating to provide this property.

Figure 4D:
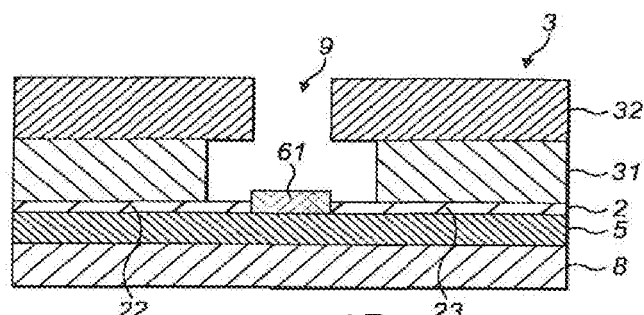
Figure 4E:
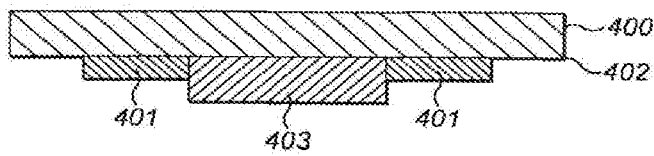

FIG. 4D shows a further step in the process where the lift-off resist 31 has been undercut using solvent developer.

Figure 4F:
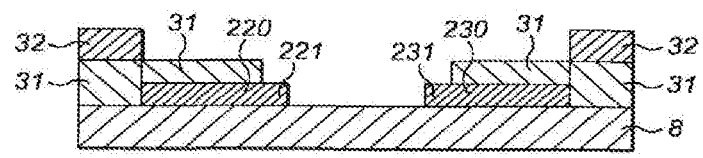

FIG. 4F shows a further section of the structure relating to the patterns created by both imprint tool heights 403 and 401. The structure reflects the situation after the imprint tool 400 has been removed and the resist layers 31 and 32 etched by oxygen plasma so as to expose sections 221 and 231 of the regions of conductive material 220 and 230. Unexposed regions 220 and 230 of conductive material have a layer of lift-off resist 31 deposited directly above them. In this instance the height 401 of imprint tool 400 is such that there is no remaining UV curable polymer 32 remaining above regions of conductive material 220 and 230.

Figure 4G:
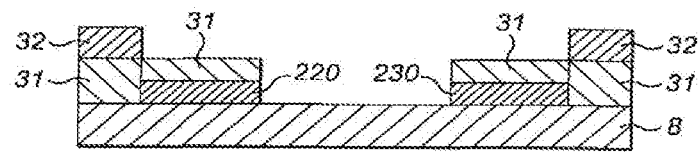

FIG. 4G shows a further stage where the exposed sections 221 and 231 have been completely removed.

Figure 4H:
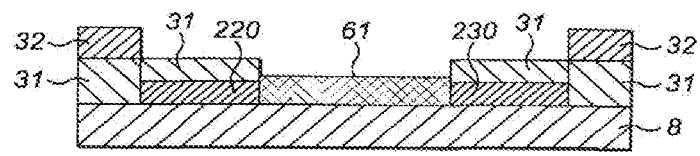

FIG. 4H shows a further stage where dielectric material 61 has been deposited but does not coat either lift-off resist material 31 or UV curable polymer material 32.

Figure 4I:
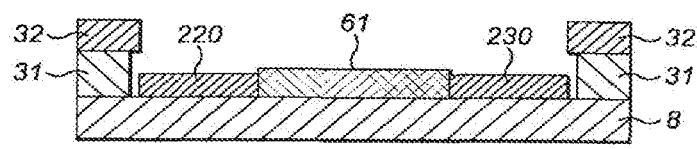

FIG. 4I shows a further stage where lift-off resist material 31 has been undercut using a solvent developer. In this case the undercut process has completely removed the lift-off resist material 31 over conductive regions 220 and 230.

Figure 4J:
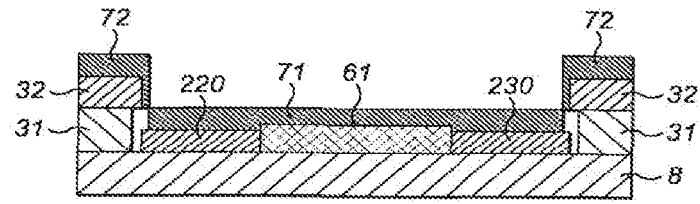

FIG. 4J shows a further stage where a conductive material has been deposited over the structure creating regions 71 and 72. Region 71 provides a conductive pathway between conductive regions 220 and 230. Region 72 covers UV curable polymer 32.

Figure 4K:
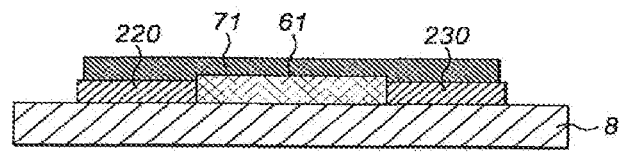

FIG. 4K shows a further stage where lift-off resist 31 is completely removed by solvent developer. In the same process remaining UV curable polymer material 32 is removed and conductive region 72.

Figure 4L:
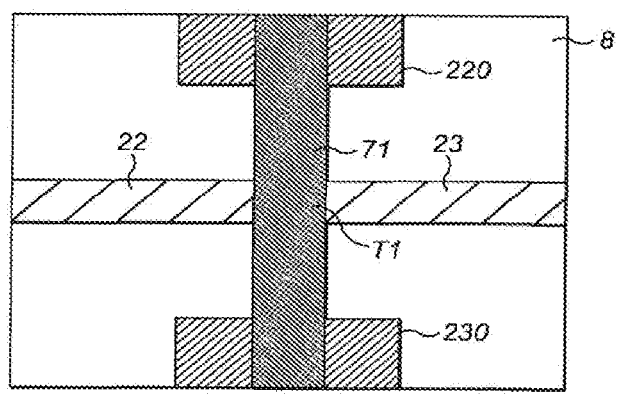

FIG. 4L shows the full structures bringing together the structures described in FIGS. 4A-4D and FIGS. 4F-4K. A thin-film transistor T1 has been formed consisting of semiconductor layer 5 (not shown) below conductive layers 22 and 23, corresponding respectively to source and drain terminals, gate dielectric layer 61 (not shown) and gate conductive layer 71. Layer 71 extends beyond the transistor T1 to terminals 220 and 230, which could be a voltage rail or drain terminal of a further device. The structure shows the potential to create thin-film gates or circuits by this method.

Figure 5A:
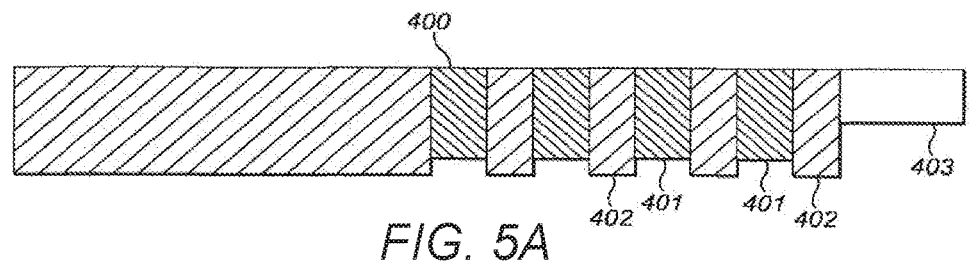
FIGS. 5A, 5B, 5C, 5D, 5E, 5F, 5G, 5H, 5I, 5J, 5K, 5L, 5M, 5N, 5O, 5P, 5Q, 5R, 5S, 5T, 5U, 5V, and 5W illustrate a circuit (itself embodying the invention) and processes to fabricate a circuit in a method embodying the invention.
Figure 5B:
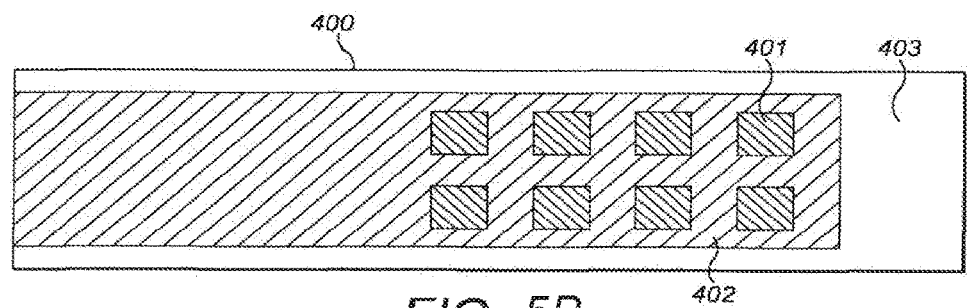
Figure 5C:
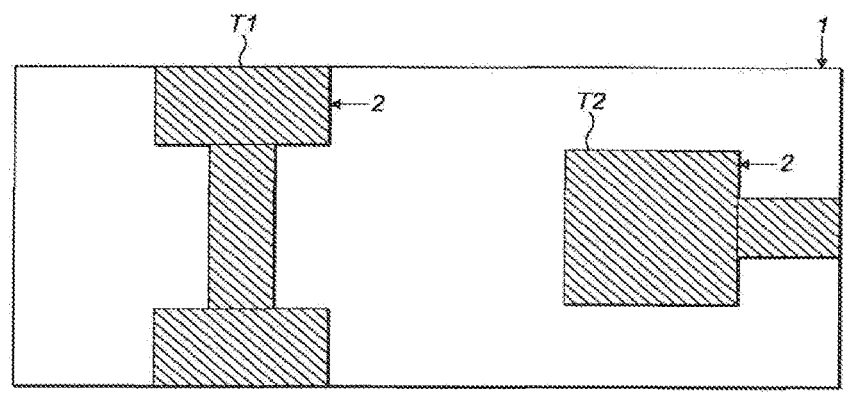
Figure 5D:
Figure 5E:
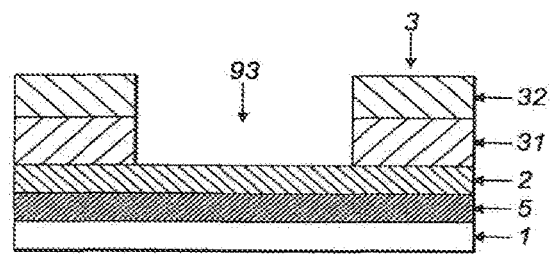

Referring now to FIGS. 5A, 5B, 5C, 5D, 5E, 5F, 5G, 5H, 5I, 5J, 5K, 5L, 5M, 5N, 5O, 5P, 5Q, 5R, 5S, 5T, 5U, 5V, and 5W, this illustrates a circuit and processes to fabricate such a circuit in methods embodying the invention. FIG. 5A shows an imprint tool 400 with features of different heights 401, 402 and 403. FIG. 5B shows a top-view of the same imprint tool 400. FIG. 5C shows a top-view of a substrate 1 supporting pre-patterned semiconductive and conductive regions 5 and 2 (5 is not shown), which will form part of two discrete electronic devices T1 and T2. FIG. 5D shows a side-view of substrate 1 supporting regions of semiconductive material 5 and conductive material 2. FIG. 5E shows a stage in the process where a resist stack 3 has been deposited onto substrate 1. Resist stack 3 consists of lift-off resist covering 31 and UV curable polymer 32. Resist stack 3 has been patterned by urging imprint tool 400, exposing to UV light and removing imprint tool 400 to create different height features relating to 401, 402 and 403. In the section of substrate 1 shown in FIG. 5E a window 93 has been created after removal of residual resist stack 3 from imprint features (matching height 402 on imprint tool 400) so as to expose the top surface of conductive region 2.

Figure 5F:
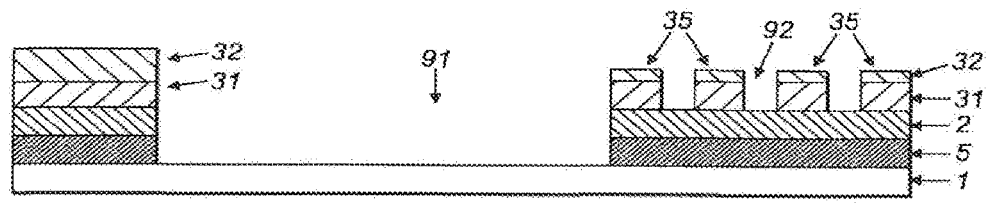

Referring now to FIG. 5F this shows a different section of the substrate 1 after imprinting with imprint tool 400 and removal of residual resist stack 3. The window 91 shown in this section of substrate 1 does not contain any conductive material 2 or semiconductive material 5. Resist stack 3 has been removed from window 91 during the process so as to expose the top surface of substrate 1. Window 92 has been additionally formed over T2 from imprint features height 401 and 402, followed by removal of residual resist stack 3 from within the trenches formed by the imprint tool 400. This leaves raised features 35 consisting of lift-off resist covering 31 and UV curable polymer 32. Window 93 has been formed over T1 from imprint features height 402.

Figure 5G:
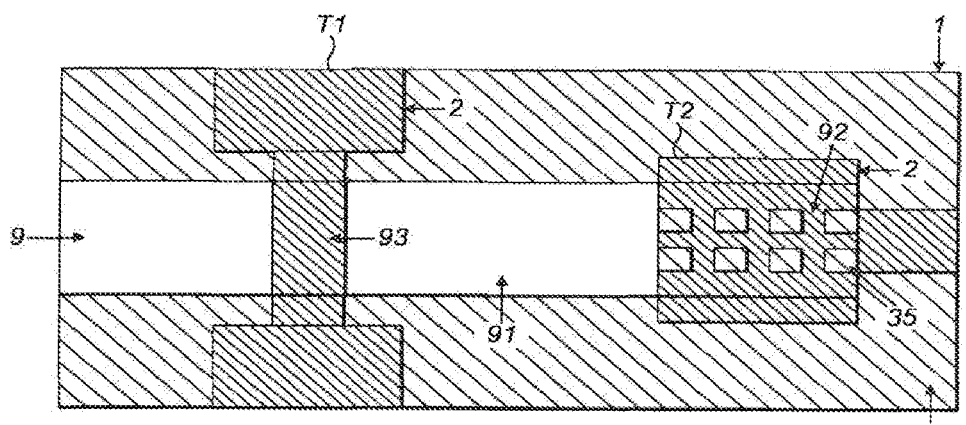

FIG. 5G shows a top-view of substrate 1 with a covering of resist stack 3 (only UV curable resist 32 is shown). Window 9 covers the entire area over T1 and T2, in which the imprint tool has been applied. Window 91 covers the area between T1 and T2. Window 92 covers the area of T1, containing raised features 35 and exposed areas of conductive material 2.

Figure 5H:
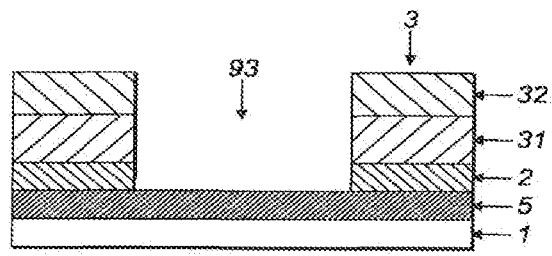

FIG. 5H shows a further stage in the process where the exposed area of conductive material 2 within window 93 has been removed, so as to reveal the top-surface of semiconductive material 5.

Figure 5I:
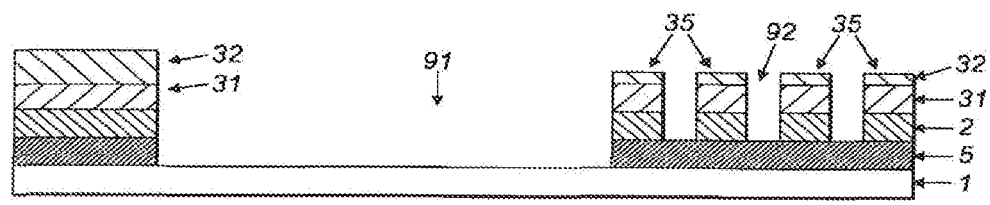

FIG. 5I shows a further stage in the process where the exposed area of conductive material 2 within window 92 has been removed, so as to reveal the top-surface of semiconductive material 5.

Figure 5J:
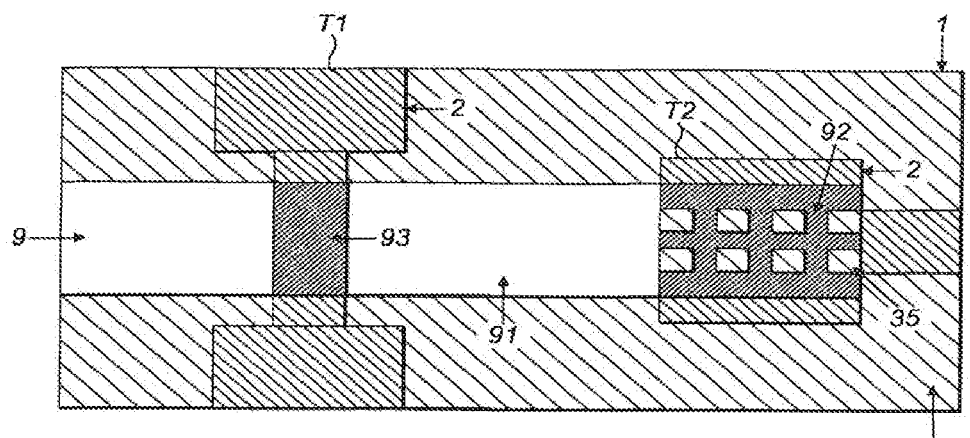

FIG. 5J shows a top-view of the removal of conductive material from windows 92 and 93.

Figure 5K:
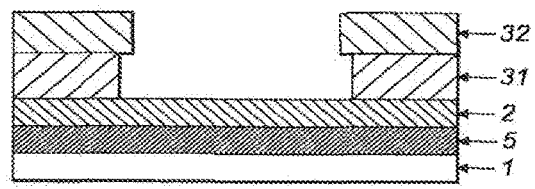
Figure 5L:
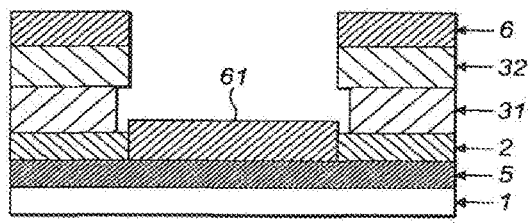
Figure 5M:
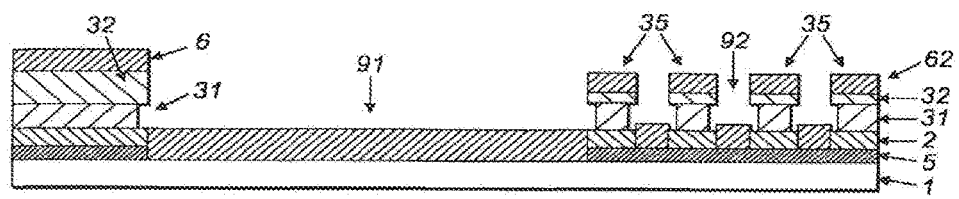
Figure 5N:
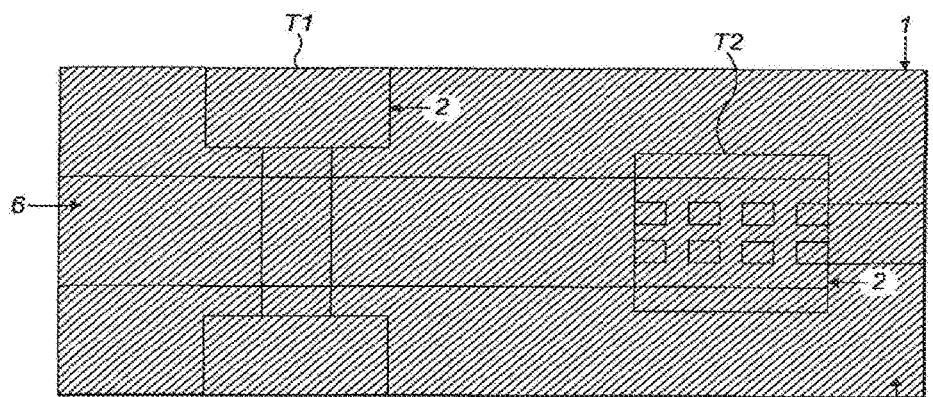

FIG. 5K shows a further stage in the process where lift-off resist material 31 has been laterally etched to create an undercut. FIG. 5L shows a further stage where dielectric material 6 has been deposited over the substrate, creating device dielectric region 61 within window 93. FIG. 5M shows the same process to deposit dielectric material 6 within windows 91 and 92, creating dielectric regions 62 in window 92. FIG. 5N shows the top-view of the structure covering T1 and T2 with dielectric material 6.

Figure 5O:
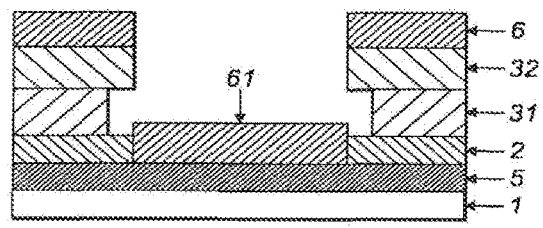
Figure 5P:
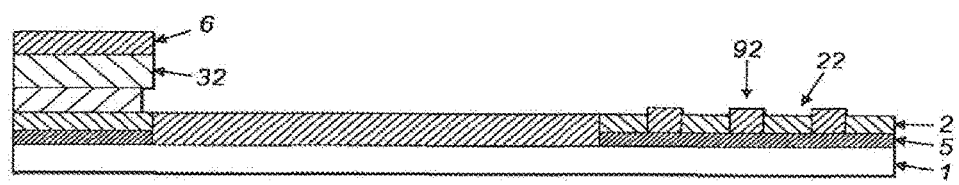
Figure 5Q:
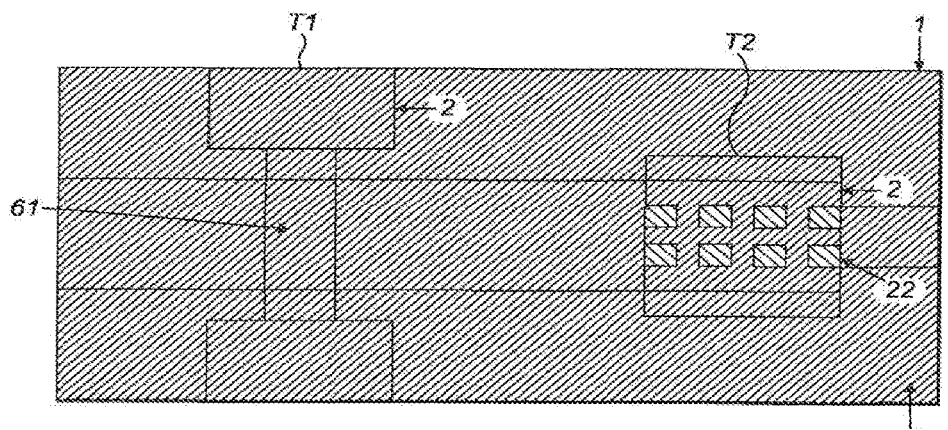

FIG. 5O shows a further stage in the process where lift-off resist material 31 has been further laterally etched (solvent process). In FIG. 5P the effect of this process is shown, with the removal of lift-off resist 31 from window 92 in the same process removing regions of dielectric material 62, to leave patterned areas 22 of conductive material 2. FIG. 5Q shows a top-view of the substrate after conductive regions 22 have been exposed.

Figure 5R:
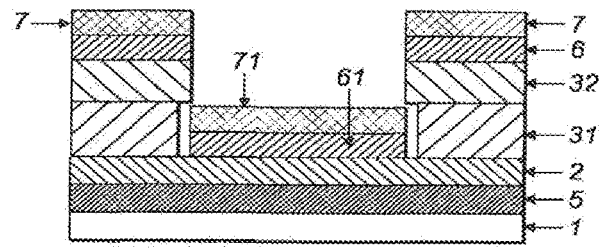
Figure 5S:
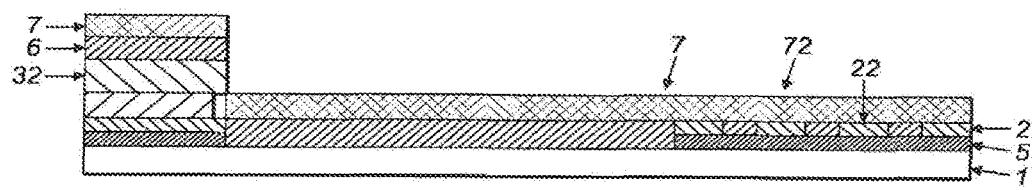
Figure 5T:
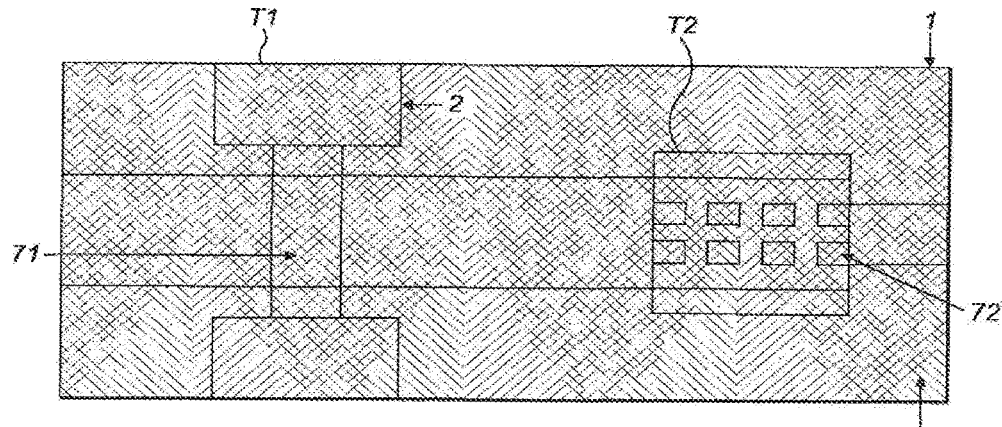

FIG. 5R shows a further stage in the process where a layer of conductive material 7 has been deposited onto the substrate, creating device conductive region 71 within window 93. In FIG. 5S the same process has provided a conductive region 72 which connects to conductive region 22. FIG. 5T shows a top-view of the configuration after deposition of conductive layer 7.

Figure 5U:
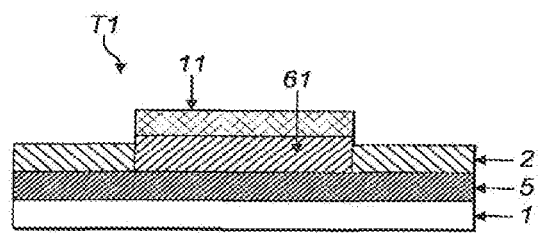
Figure 5V:
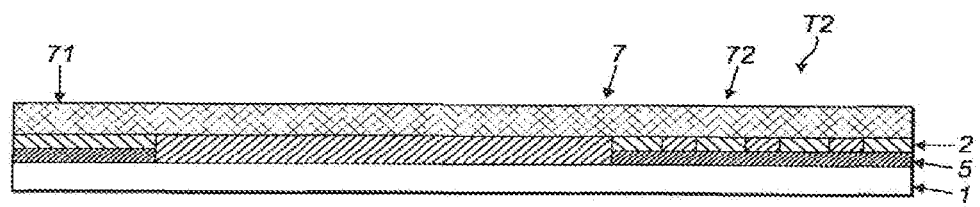
Figure 5W:
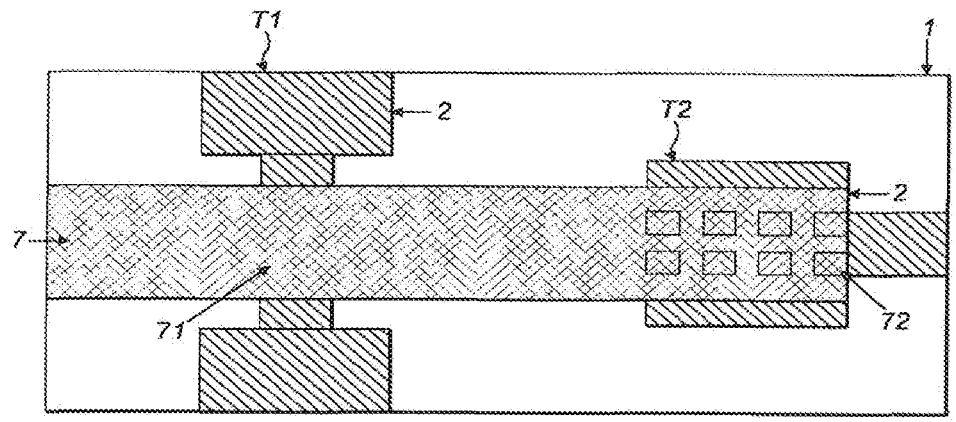

FIG. 5U shows a further stage in the process where resist stack 3 has been removed by solvent exposure of lift-off resist 31. In the same process regions of dielectric material 6 and conductive material 7 have been removed so as to leave device T1. In FIG. 5V the structure after removal of resist stack 3 is shown. Device T2 has been completed in window 92. The conductive layer 7 connects device T2 to T1 (the pathway was not previously shown as resist stack 3 was in front of this connection on the side-view). FIG. 5W shows the final top-view of the connection between devices T1 and T2.

Figure 6A:
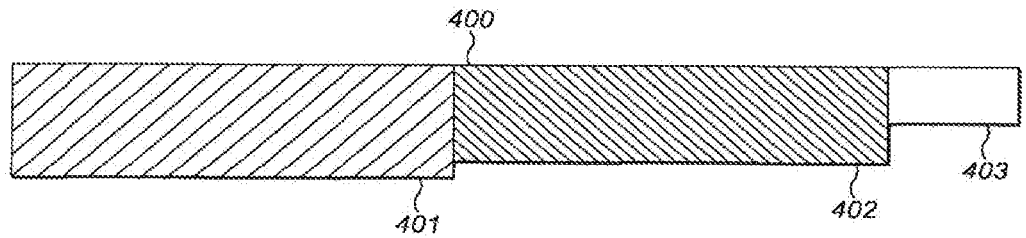
FIGS. 6A, 6B, 6C, 6D, 6E, 6F, 6G, 6H, 6I, 6J, 6K, 6L, 6M, 6N, 6O, 6P, 6Q, 6R, 6S, 6T, 6U, 6V, and 6W illustrate another circuit (itself embodying the invention) and processes to fabricate a circuit in another method embodying the invention.
Figure 6B:
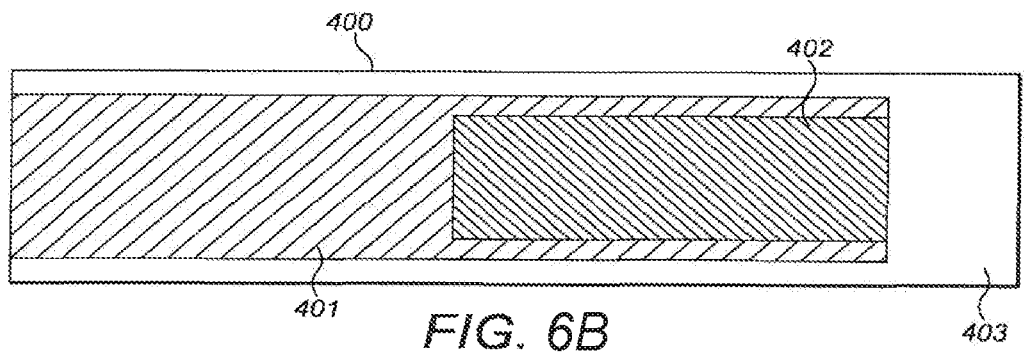
Figure 6C:
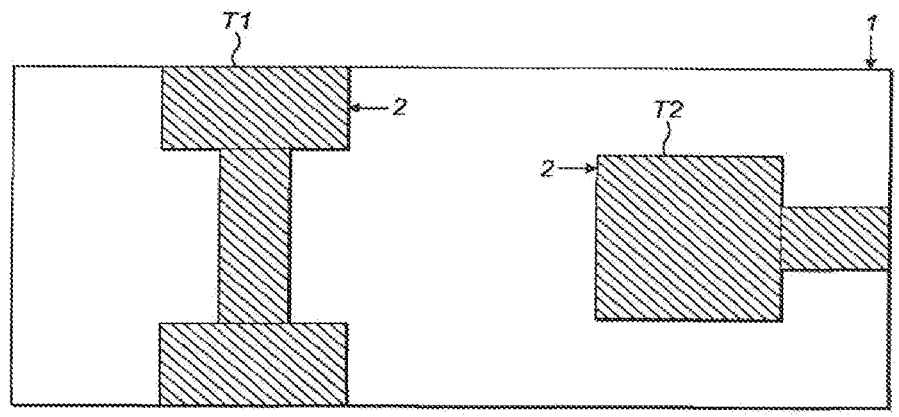

Referring now to FIGS. 6A, 6B, 6C, 6D, 6E, 6F, 6G, 6H, 6I, 6J, 6K, 6L, 6M, 6N, 6O, 6P, 6Q, 6R, 6S, 6T, 6U, 6V, and 6W, this illustrates a circuit and processes to fabricate such a circuit in methods embodying the invention. FIG. 6A shows an imprint tool 400 with features of different heights 401, 402 and 403. FIG. 6B shows a top-view of the same imprint tool 400. FIG. 6C shows a top-view of a substrate 1 supporting pre-patterned semiconductive and conductive regions 5 and 2 (5 is not shown), which will form part of two discrete electronic devices T1 and T2.

Figure 6D:
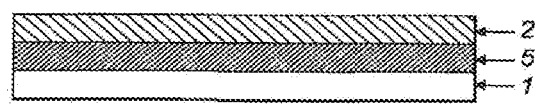
Figure 6E:
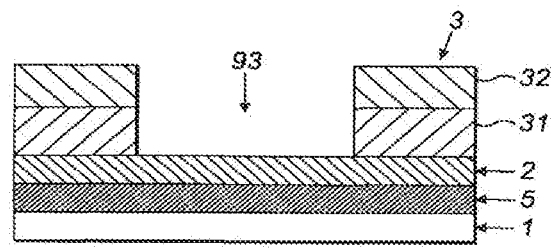

FIG. 6D shows a side-view of substrate 1 supporting regions of semiconductive material 5 and conductive material 2. FIG. 6E shows a stage in the process where a resist stack 3 has been deposited onto substrate 1. Resist stack 3 consists of lift-off resist covering 31 and UV curable polymer 32. Resist stack 3 has been patterned by urging imprint tool 400, exposing to UV light and removing imprint tool 400 to create different height features relating to 401, 402 and 403. In the section of substrate 1 shown in FIG. 6E a window 93 has been created after removal of residual resist stack 3 from imprint features (matching height 402 on imprint tool 400) so as to expose the top surface of conductive region 2.

Figure 6F:
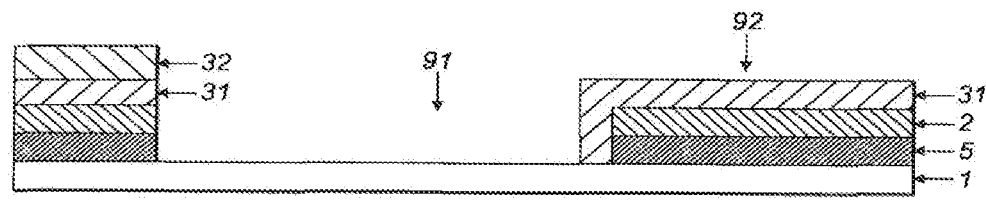

Referring now to FIG. 6F this shows a different section of the substrate 1 after imprinting with imprint tool 400 and removal of residual resist stack 3. The window 91 shown in this section of substrate 1 does not contain any conductive material 2 or semiconductive material 5. Resist stack 3 has been mostly removed from window 91 during the process so as to expose the top surface of substrate 1. Window 92 has been additionally formed over T2 from imprint features height 402, followed by removal of residual resist stack 3 from within the trenches formed by the imprint tool 400. Window 93 has been formed over T1 from imprint features height 402.

Figure 6G:
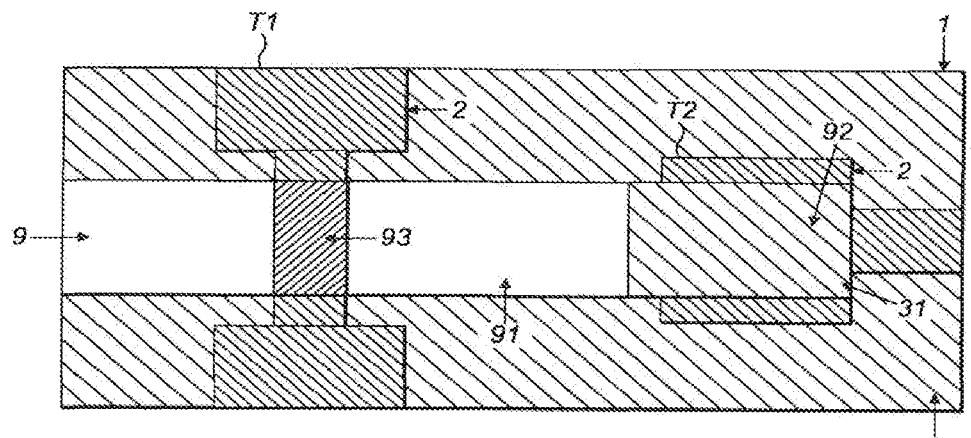

FIG. 6G shows a top-view of substrate 1 with a covering of resist stack 3. Window 9 covers the entire area over T1 and T2, in which the imprint tool has been applied. Window 91 covers the area between T1 and T2. Window 92 covers the area of T1 where the top-surface of lift-off resist layer 31 has been exposed.

Figure 6H:
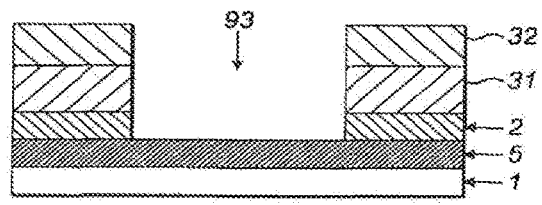
Figure 6I:
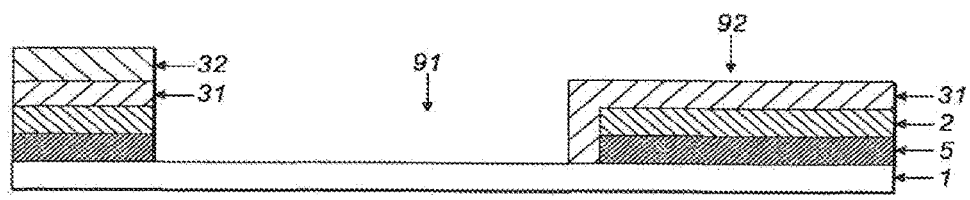
Figure 6J:
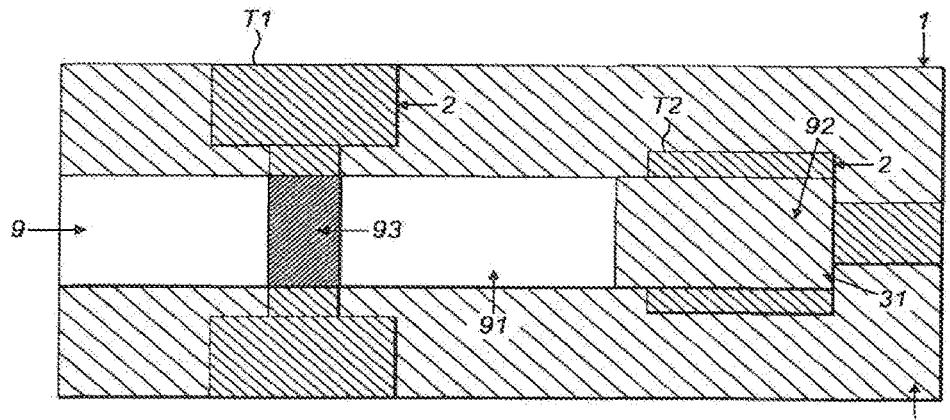

FIG. 6H shows a further stage in the process where the exposed area of conductive material 2 within window 93 has been removed, so as to reveal the top-surface of semiconductive material 5. FIG. 6I shows the same further stage in the process as FIG. 6H which has no apparent effect in this section of the substrate 1. FIG. 6J shows a top-view of the removal of conductive material from window 93.

Figure 6K:
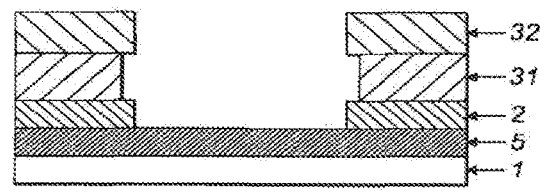
Figure 6L:
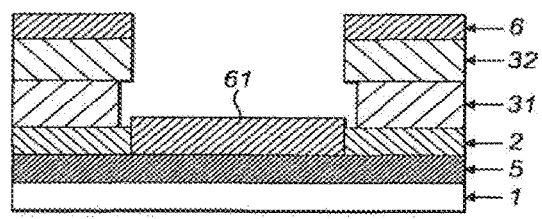
Figure 6M:
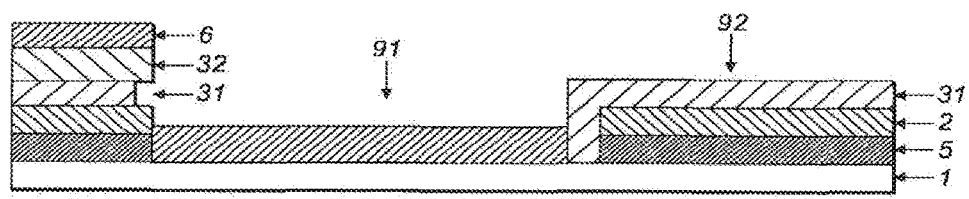
Figure 6N:
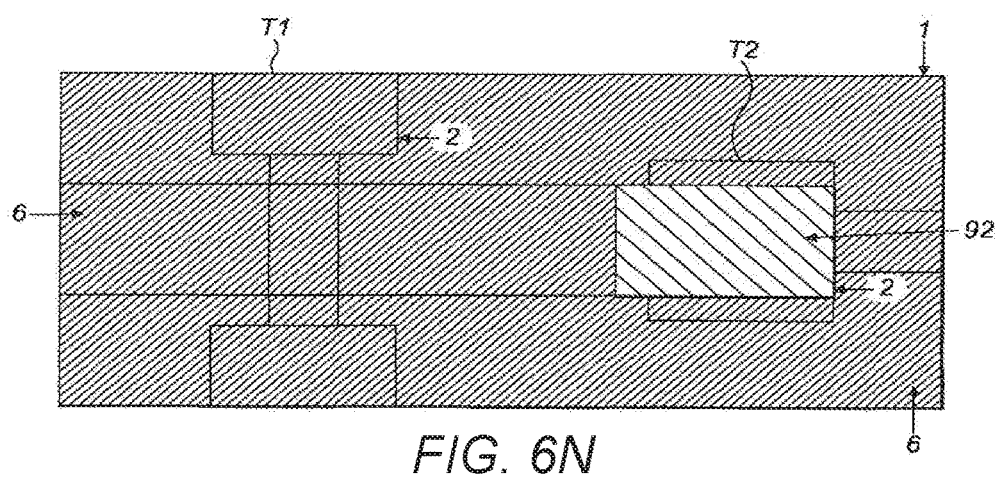

FIG. 6K shows a further stage in the process where lift-off resist material 31 has been laterally etched to create an undercut. FIG. 6L shows a further stage where dielectric material 6 has been deposited over the substrate, creating device dielectric region 61 within window 93. FIG. 6M shows the same process to deposit dielectric material 6 within window 91. In window 92, however, the properties of lift-off resist material 31 are such as to completely prevent deposition of layer 6 within this window. FIG. 6N shows the top-view of the structure covering T1 and T2 with dielectric material 6 covering the entire substrate except for window 92.

Figure 6O:
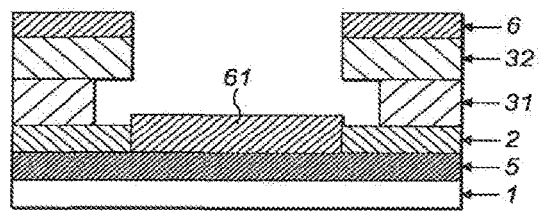
Figure 6P:
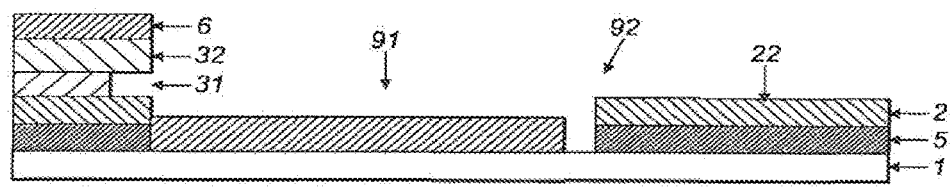
Figure 6Q:
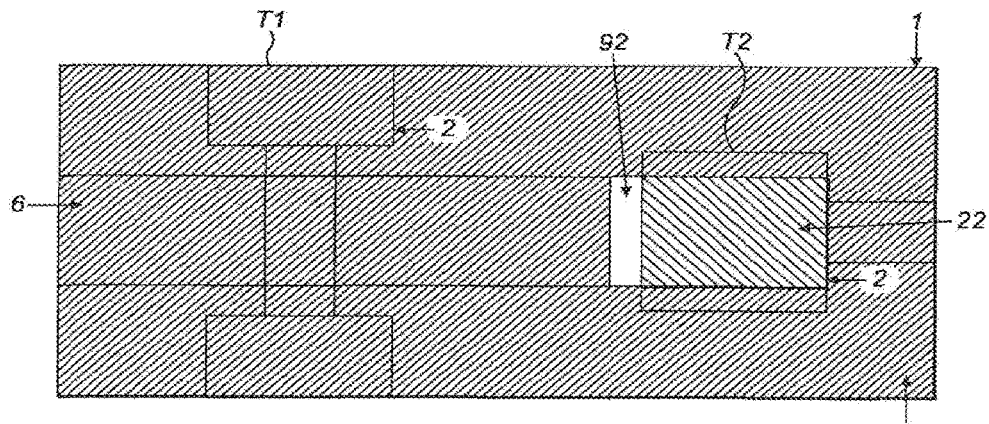

FIG. 6O shows a further stage in the process where lift-off resist material 31 has been further laterally etched (solvent process). In FIG. 6P the effect of this process is shown, with the removal of lift-off resist 31 from window 92 exposing conductive material 2 and creating conductive region 22. FIG. 6Q shows a top-view of the substrate after conductive regions 22 have been exposed.

Figure 6R:
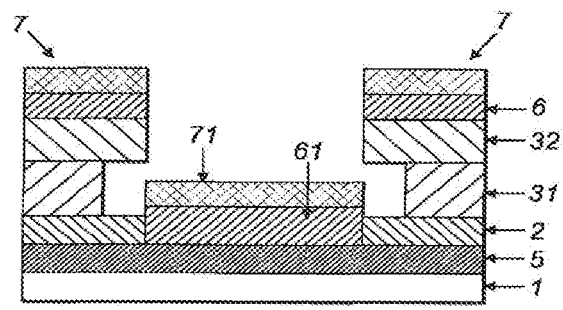
Figure 6S:
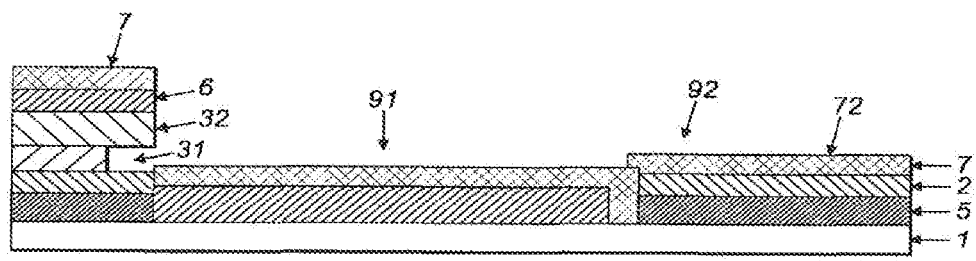
Figure 6T:
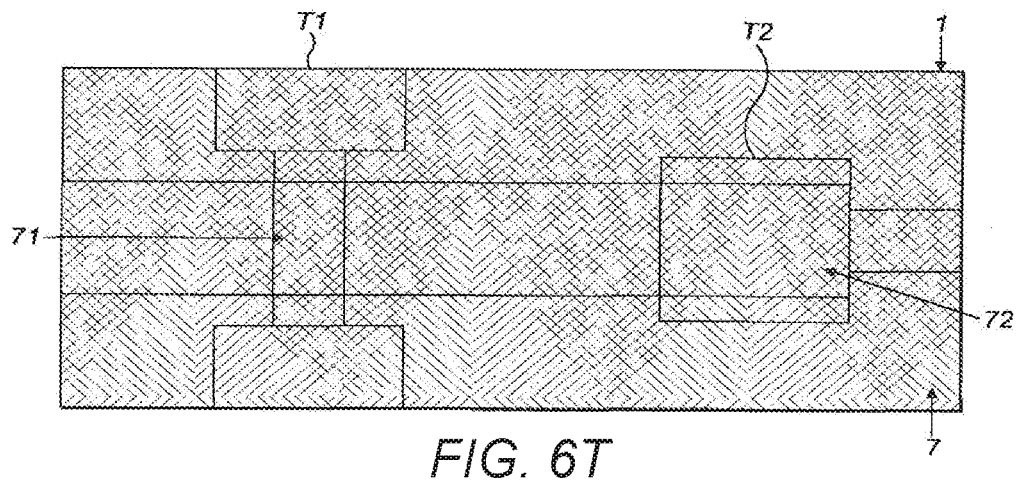

FIG. 6R shows a further stage in the process where a layer of conductive material 7 has been deposited onto the substrate, creating device conductive region 71 within window 93. In FIG. 6S the same process has provided a conductive region 72 which connects to conductive region 22. FIG. 6T shows a top-view of the configuration after deposition of conductive layer 7.

Figure 6U:
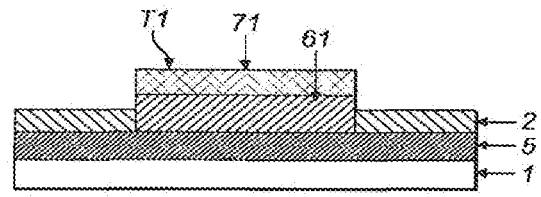
Figure 6V:
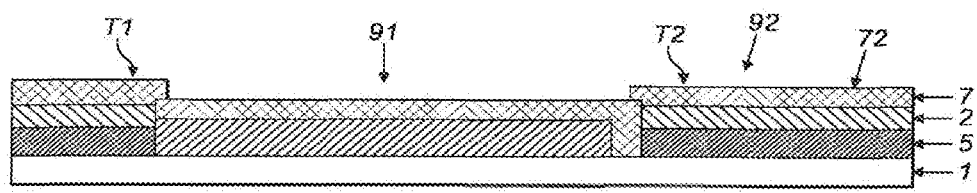
Figure 6W:
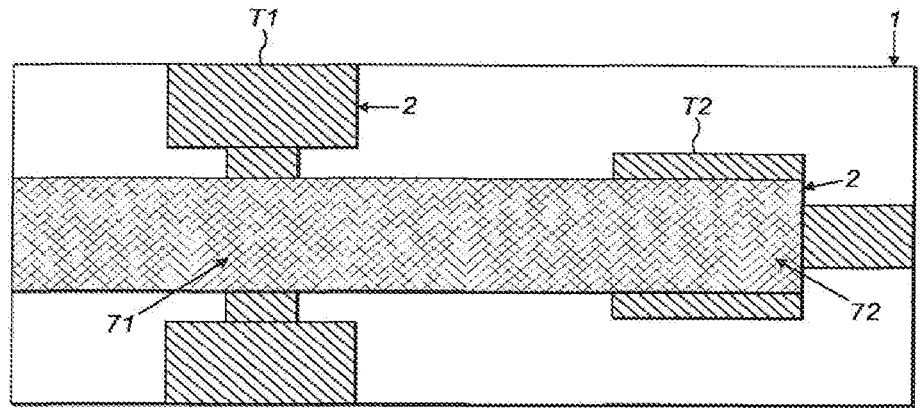

FIG. 6U shows a further stage in the process where resist stack 3 has been removed by solvent exposure of lift-off resist 31. In the same process regions of dielectric material 6 and conductive material 7 have been removed so as to leave device T1. In FIG. 6V the structure after removal of resist stack 3 is shown. Device T2 has been completed in window 92. The conductive layer 7 connects device T2 to T1 (the pathway was not previously shown as resist stack 3 was in front of this connection on the side-view). FIG. 6W shows the final top-view of the connection between devices T1 and T2.

Figure 7A:
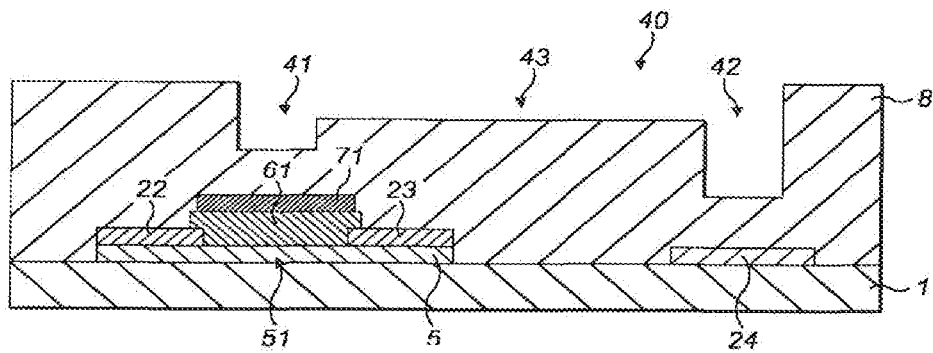
FIGS. 7A, 7B, and 7C are schematic representations of steps in a method of manufacturing an electrical circuit in accordance with an embodiment of the invention.
Figure 7B:
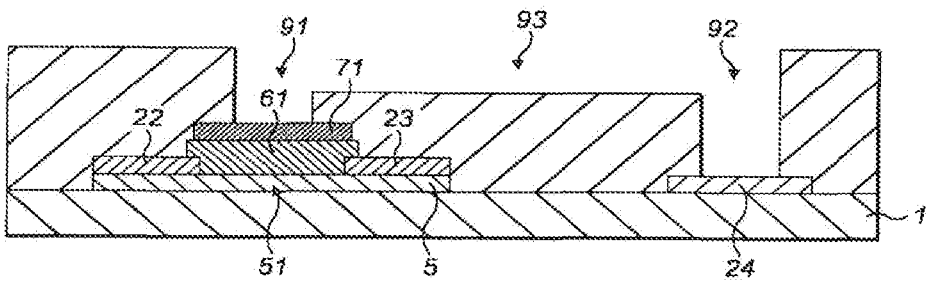
Figure 7C:
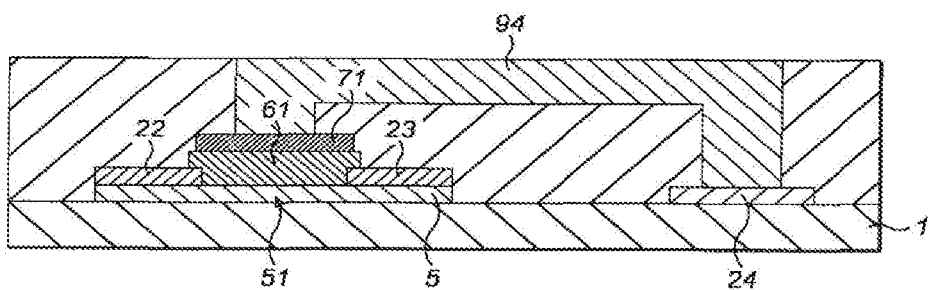
Figure 8A:
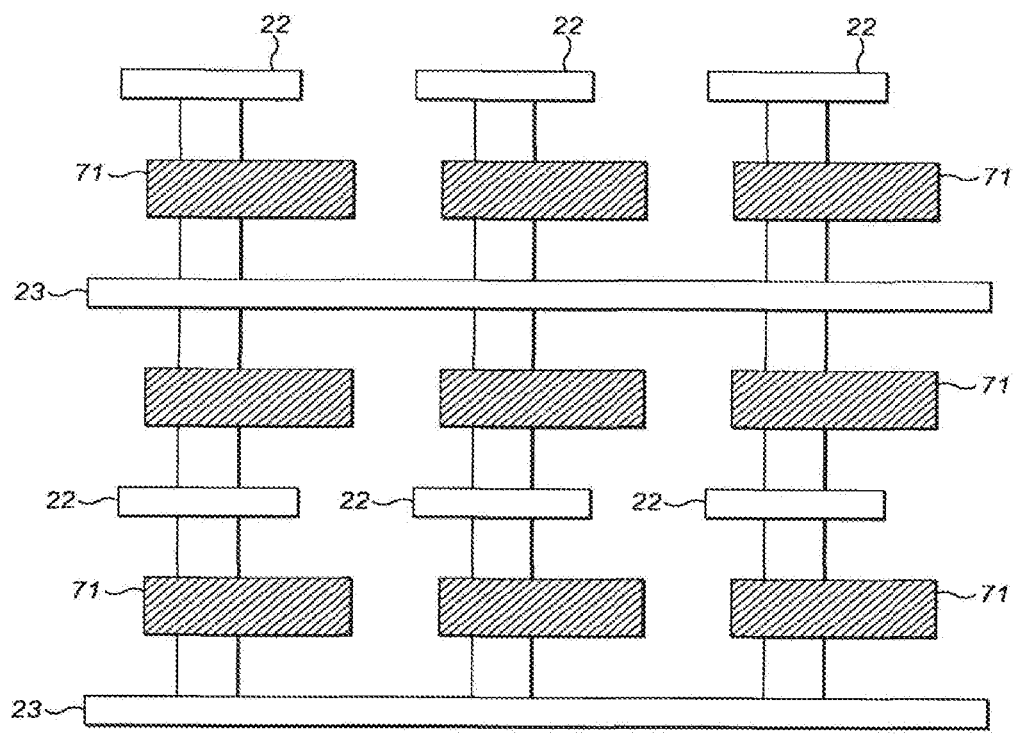
FIGS. 8A, 8B, 8C, and 8D illustrate steps in a method of manufacturing an electronic circuit embodying the invention, in which selected interconnections are formed between a plurality of transistors, each transistor embodying the invention, and having been formed by a method also embodying the invention.

Referring now to FIGS. 7A, 7B, and 7C, this shows part of another method embodying the invention in which an electrical connection is made between the gate terminal 71 of a transistor manufactured using an embodiment of the invention, and another portion of conductive material 24 supported by the substrate. It will be appreciated that this portion 24 of conductive material may be a terminal of another device formed on the substrate, it may be a conductive pad for making further electrical connections, it may be a ground rail, supply voltage rail, or any other conductive pad or track for incorporation in an electronic device or circuit. Also, although the portion 24 in this example is formed directly on the substrate, in alternative embodiments it may be supported by an underlying layer or layers, e.g. of semiconductive material, of dielectric material, or a multi-layer structure comprising a plurality of different layer materials. Also, the portion 24 in certain embodiments may itself be a portion of semiconductive material, to which electrical connection is required. Referring to FIG. 8A, a thin-film transistor embodying the invention has been formed, comprising source and drain terminals 22, 23 connected by a semiconductive channel or layer 51, with a gate terminal 71 arranged over the semiconductive layer 51 and separated from it by a gate dielectric layer 61. In this embodiment, the gate dielectric overlaps surfaces (the upper surfaces in the orientation of the figure) of the source and drain regions 22 and 23, and the gate covers a portion, but not all, of the upper surface of the gate dielectric 61. A covering of dielectric material 8 has been formed over the transistor structure and the further conductive region 24, this dielectric covering 8 also having a depression 40 formed in its upper surface. In this example, the depression 40 does not have uniform depth. Instead, it comprises a first depression portion 41 having a first depth and arranged over the gate terminal 71, a second depression portion 42 having a second, deeper depth, and arranged over the further conductive portion 24. The depression 40 also comprises a third depression portion 43, having a shallower depth, and connecting the first and second depression portions 41, 42. As will be appreciated, the depression 40 in FIG. 8A may be produced using a variety of techniques, for example by imprinting using a multi-level imprint tool. After producing the structure shown in FIG. 8A, a suitable technique is used, e.g. etching, to remove dielectric material so as to develop the first depression portion 41 into a first hole 91 which extends through the dielectric layer 8 to the gate 71. The second depression 42 has been developed into a second hole 92 which extends through the layer 8 to the upper surface of the further conductive portion 24. The third depression portion 43 has also been developed so that it provides a channel, groove, recess or other such feature 93 laterally (i.e. generally in a direction parallel to the substrate surface 1) connecting the first hole 91 to the second hole 92. Next, the holes 91 and 92 and the channel 93 are filled with electrically conductive material so as to form an interconnect 94 connecting the gate 71 to the further conductive region 24.

Figure 8B:
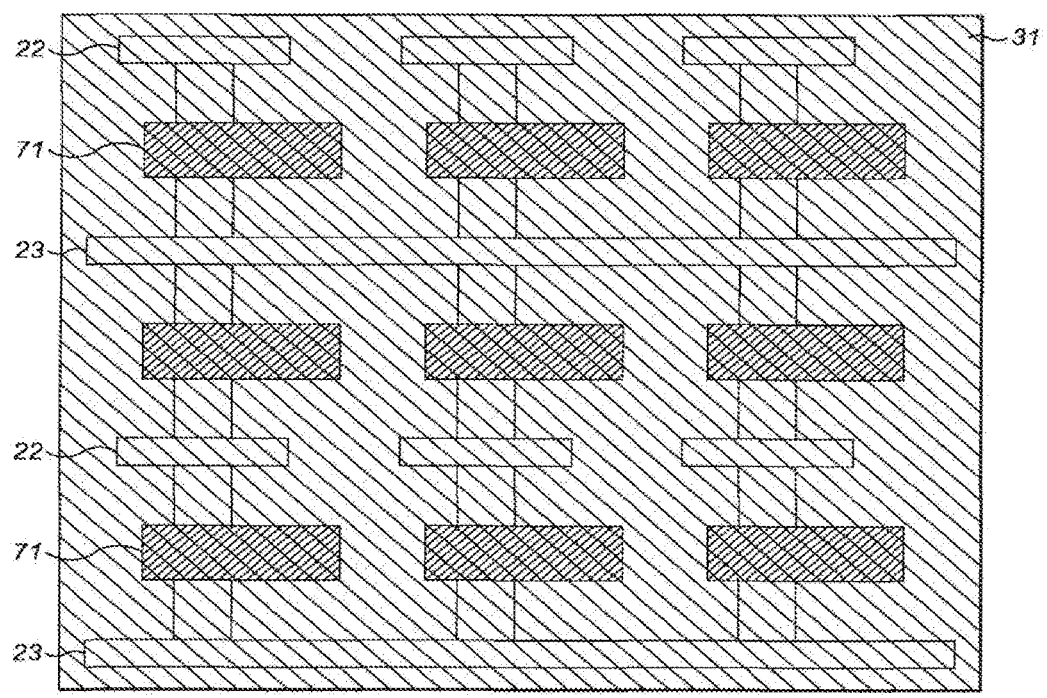
Figure 8C:
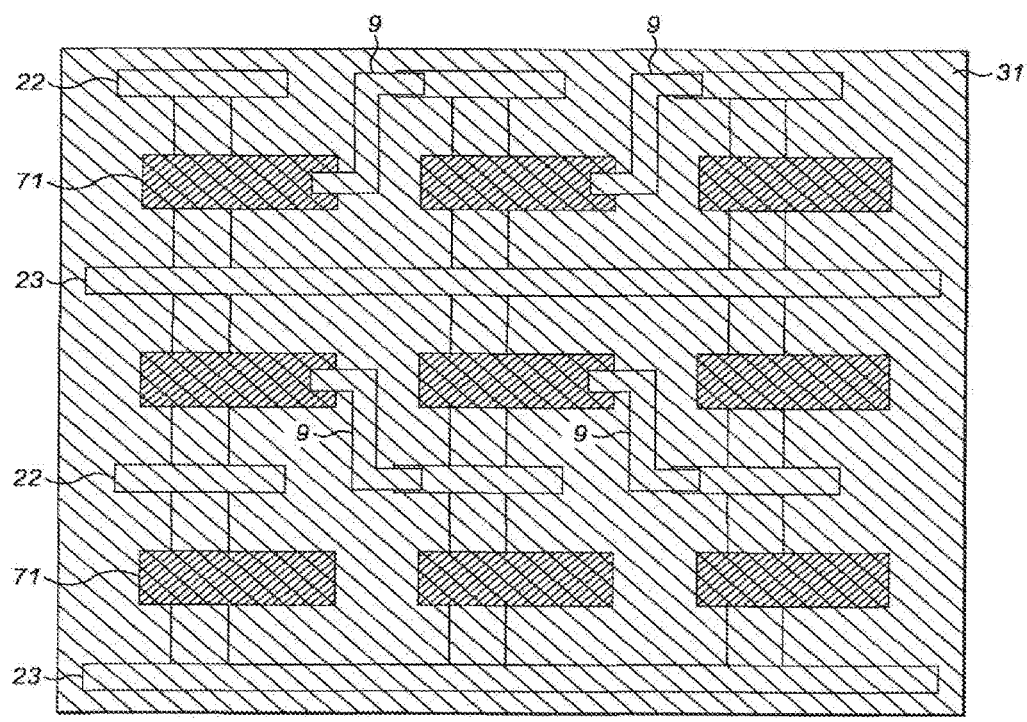
Figure 8D:
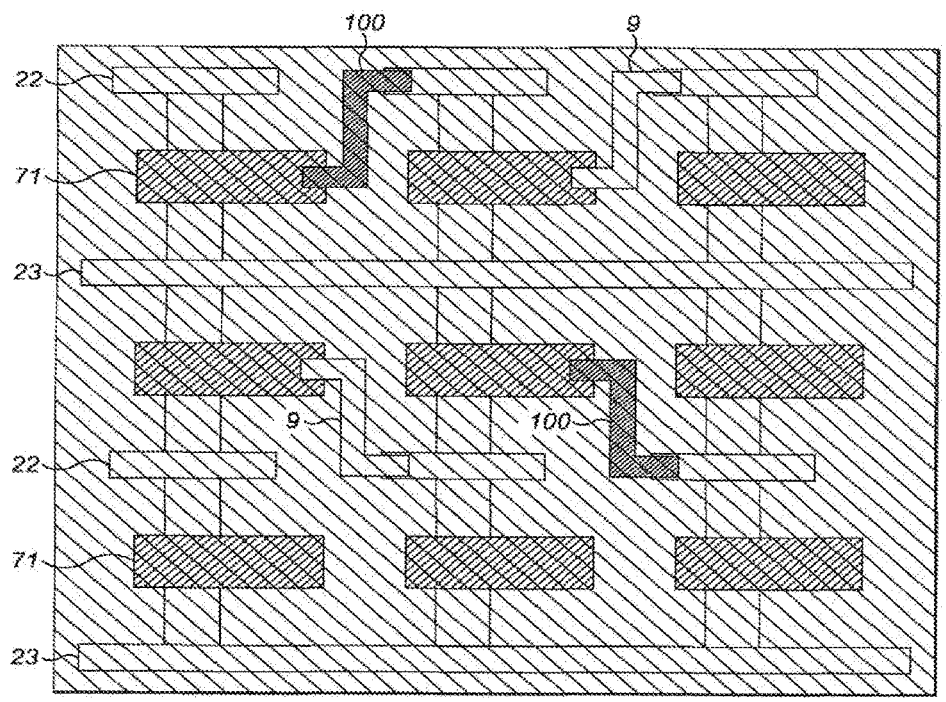

Referring now to FIGS. 8A, 8B, 8C, and 8D, this shows a regular array of thin-film transistors which have been fabricated in a method embodying the invention. FIG. 8A shows a top-view of an array of thin-film transistors comprising a trilayer of semiconductor, dielectric and conductive material 71 (only layer 71 is shown), with individual source areas 22 and shared ground areas 23. It will be appreciated that a layer of semiconductor material lies under all of the conductive portions/terminals shown on the figure (i.e. semiconductor material lies directly beneath source and drain terminals 22 and 23, and extends between the source and drain terminals to provide channels, each channel being located under a respective gate terminal 71, isolated from the gate 71 by a respective gate dielectric 61 (not shown)). FIG. 8B shows a further step where a resist layer 31 has been deposited onto the substrate (not shown). FIG. 8C shows a further step where areas of resist layer 31 has been removed creating windows 9, such as by imprinting, laser-ablation, so as to expose areas of layer 71, substrate and source terminals 22. FIG. 8D shows a further step in which two of the exposed areas 9 have been filled-in with conductive material 100, e.g. by jet-printing of conductive ink, so as to select a particular circuit. Thus, a plurality of windows have been formed through the layer of resist material 31 which previously encapsulated the plurality of transistors/switching devices, and selected windows are then filled, at least partly (in other words a deposition of conductive material is made inside the windows) with conductive material to form selected interconnections between the devices. This can be regarded as programming or configuring an electronic circuit by forming selective interconnections between pre-formed transistors.

Figure 9A:
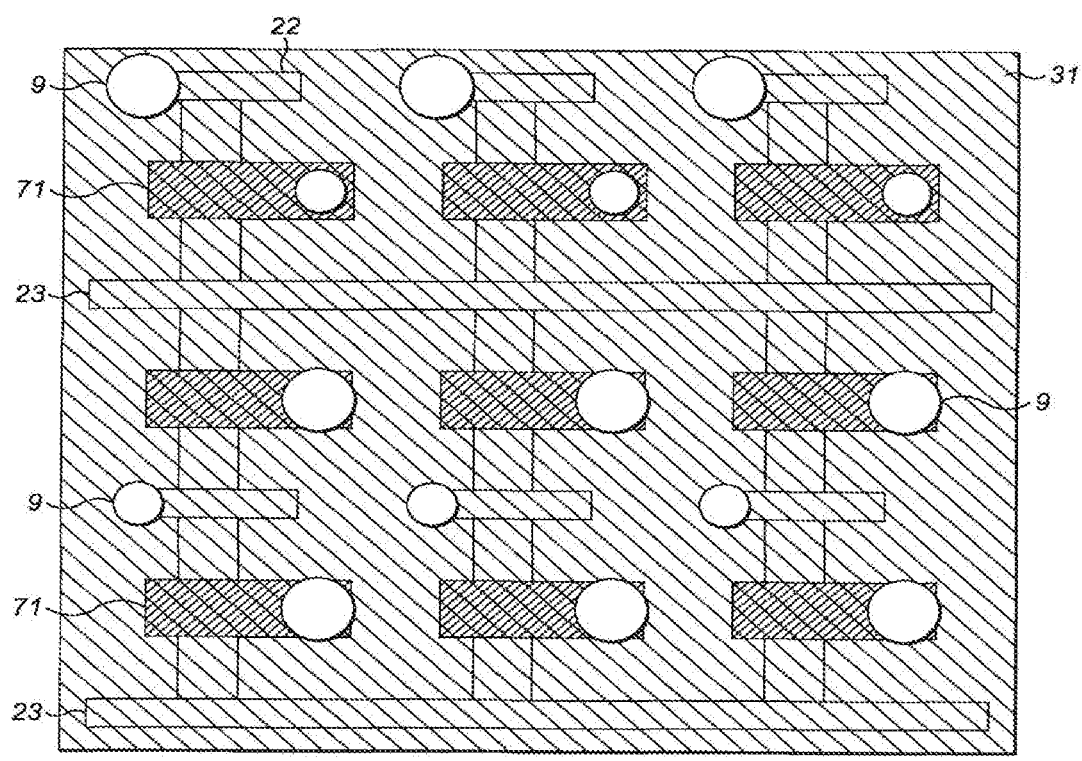
FIGS. 9A, 9B, and 9C illustrate steps in the manufacture of a thin-film transistor array in which all available programmable terminals are opened-up with via-holes, filled with conductive material, and a certain circuit is then selected by printing.
Figure 9B:
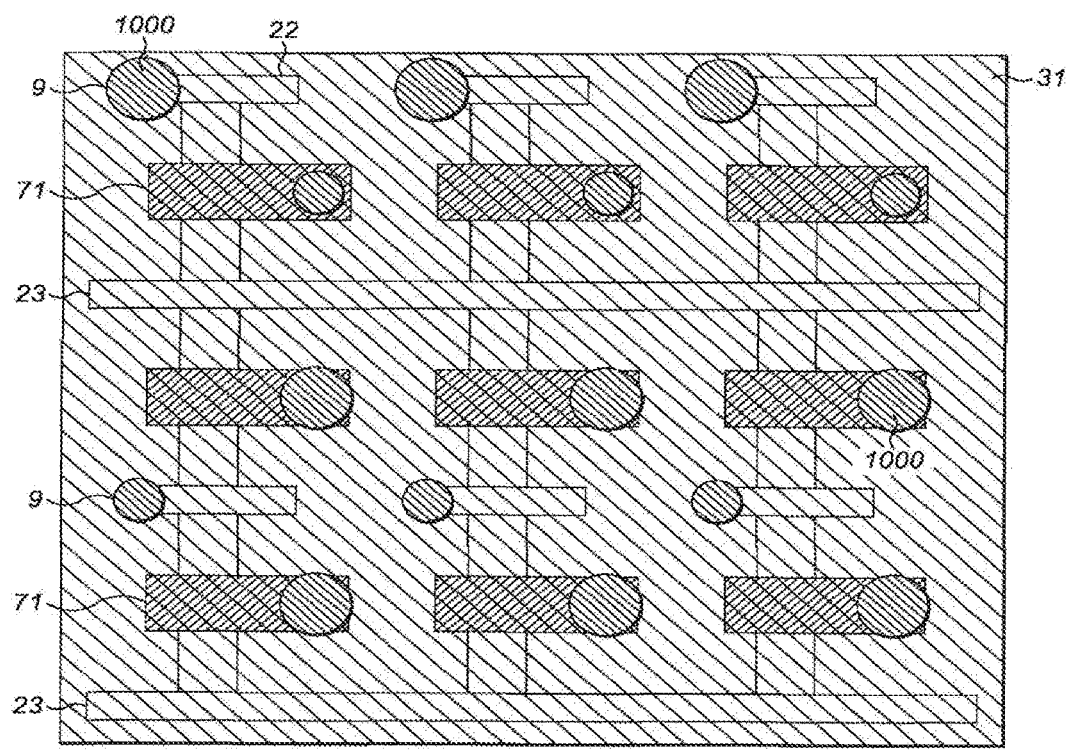
Figure 9C:
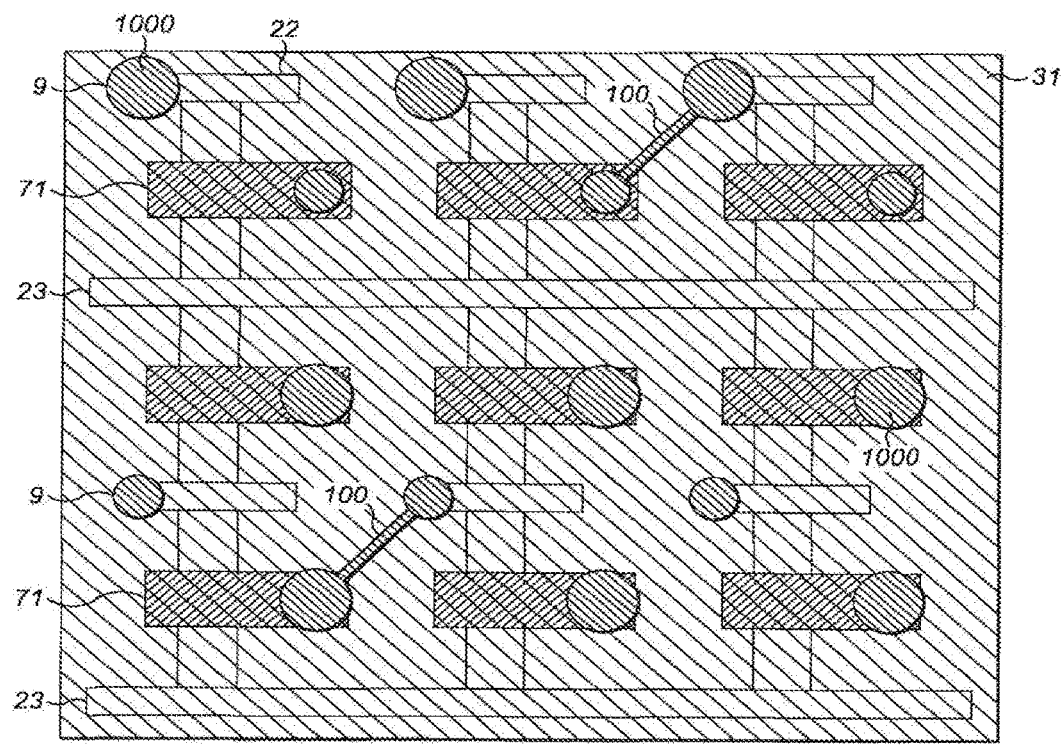

Referring now to FIGS. 9A, 9B, and 9C, this shows the same regular array of thin-film transistors as in FIG. 8A which are being programmed. FIG. 9A has a layer of resist material 31 deposited onto the transistor array with via-holes 9 positioned over each terminal position in this case fabricated by laser-drilling. FIG. 9B shows a further step where the via-holes 9 have been filled with conductive material 1000 such as silver using inkjet printing. FIG. 9C shows a final step where certain (i.e. selected) vias have been connected together with conductive material, e.g. by jet-printing of conductive ink, to form selected interconnects 100 and so program or select a particular circuit. It will be appreciated that an alternative to the step of filling-in each via-hole described in FIG. 9B is to use digital printing with conductive ink to in-fill and interconnect particular via-holes to select a desired functional circuit. The resist material 31 in this instance acts as a dielectric material for the interconnections.

Figure 10A:
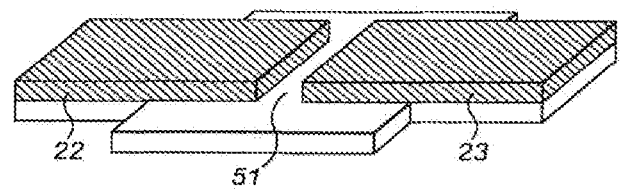
FIGS. 10A, 10B, and 10C are schematic representations of imprinting tools which may be used (and the features they form) in the manufacture of a transistor using methods embodying the invention.
Figure 10B:
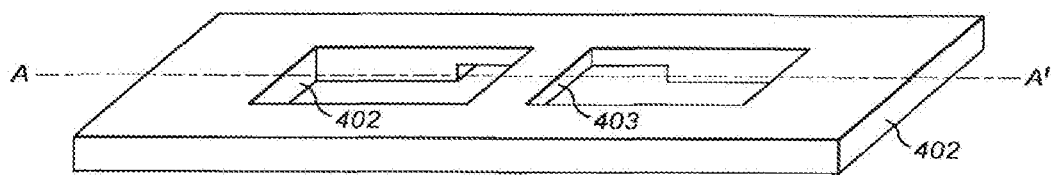
Figure 10C:
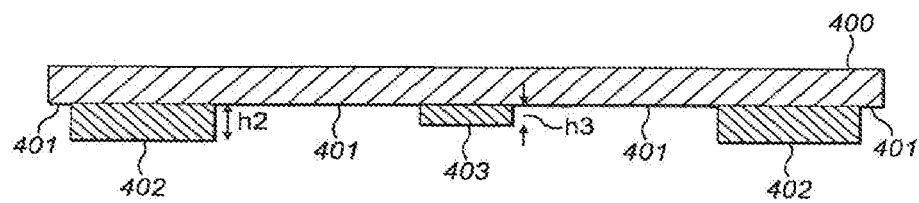

Referring now to FIGS. 10A, 10B, and 10C, this is a schematic representation of imprint tools which may be used (and the features they form) in the manufacture of a transistor using methods embodying the invention. FIG. 10A shows a layer 5 of semiconductive material supporting conductive material 2 which has been patterned into regions 22 and 23, with semiconductive channel region 51 between them. FIG. 10B shows a 3D representation of an imprint tool 400 consisting of multiple regions 401, 402 and 403. The top-portion of imprint tool 400 with region 401 is not shown for clarity. FIG. 10C shows a cross-section of imprint tool 400 taken along axis A-A' as shown in FIG. 10B. Regions 401, 402 and 403 are shown with different heights with respect to the tool 400 itself. In this case region 401 is not raised at all from the height of 400, whereas region 402 is raised by height h2 and region 403 by height h3. Features or regions 401 in this example can therefore be described as regions of a base surface (i.e. base regions) of the tool 400. Regions 401 are therefore level with the base surface; only features 402 and 403 are raised above the base surface. Feature 403 in certain embodiments of the invention is used to form the depression extending over the first portion of the region of conductive material, which in turn defines the position and extent of the connecting portion (i.e. the semiconductive channel of the device). Feature 402 in certain embodiments is a second imprint feature arranged to define a perimeter of the transistor. For example, the method in certain embodiments further comprises using the second imprint feature 402 to form a second depression in the surface of the covering of resist material, this second depression extending around the first, second, and third portions of the region of conductive material. In certain embodiments the imprint tool comprises first and second base regions 401 arranged inside the second imprint feature 402 and separated by the first imprint feature 403, the base regions defining the positions of the second and third portions of the layer of conductive material.

Figure 11A:
FIGS. 11A, 11B, 11C, 11D, 11E, 11F, 11G, and 11H are schematic representations of steps in another method of manufacturing a transistor embodying the invention.
Figure 11B:
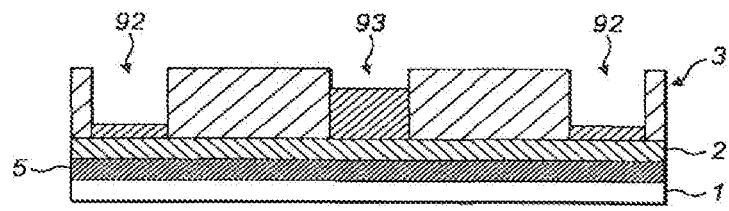
Figure 11C:
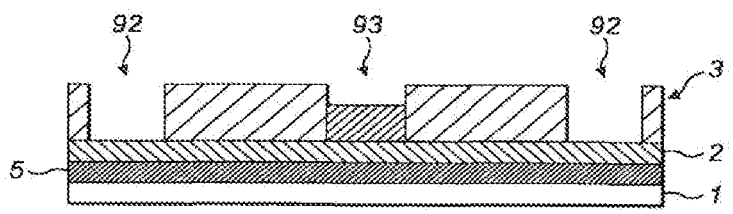
Figure 11D:
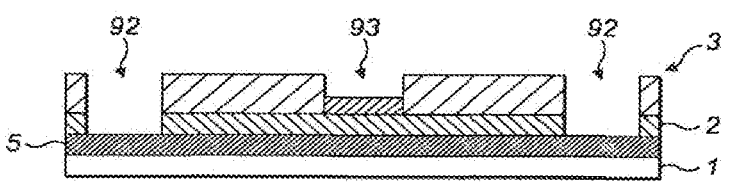
Figure 11E:
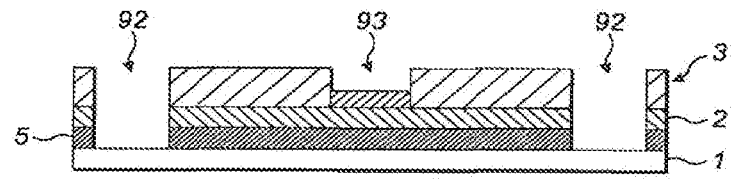
Figure 11F:
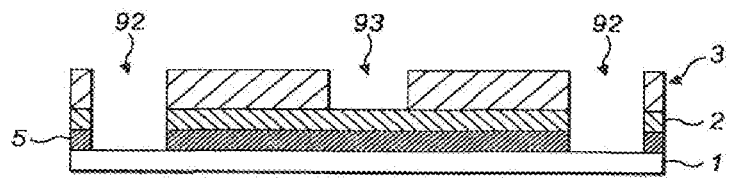
Figure 11G:
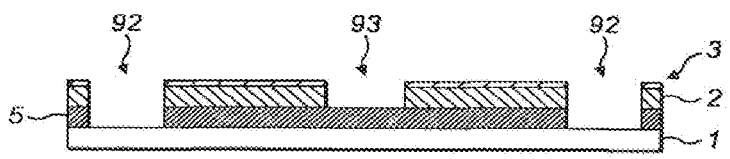
Figure 11H:
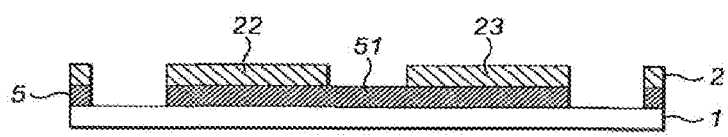

Referring now to FIGS. 11A, 11B, 11C, 11D, 11E, 11F, 11G, and 11H, this is a schematic representation of steps in another method of manufacturing a transistor embodying the invention. Referring now to FIG. 11A, this is a schematic cross section of a structure undergoing a processing step in a method embodying the invention. The structure comprises a substrate 1 supporting semiconductive layer 5 and conductive layer 2. FIG. 11B shows a stage in the process where a layer of resist material 3 has been deposited over the substrate and patterned using imprint tool 400. Windows 92 and 93 have been created corresponding to imprint regions 402 and 403, respectively. Within window 92 there is a thin-layer of residual resist material 3 covering conductive layer 2. FIG. 11C shows a further stage where the thin-layer of residual resist material 3 within window 92 has been removed by etching to expose a perimeter portion of the layer of conductor 5, in the same process reducing the overall height of resist material 3. In FIG. 11D, the exposed regions (i.e. the exposed perimeter portion in this example) of conductive material 2 have been removed by etching, such that window 92 now exposes regions of semiconductive material 5 (in this example, an underlying perimeter portion of semiconductor). Once again the resist material has been reduced in height during this etch process. In FIG. 11E, these exposed regions of semiconductive material have been removed by etching (in this example to expose an underlying perimeter portion of the substrate). FIG. 11F shows a further stage where the residual resist material 3 within window 93 has been removed by etching, further reducing the height of resist material 3 across the whole substrate. Window 93 now exposes a further region of conductive material 2. In FIG. 11G the conductive material within window 93 has been removed by etching, to expose the top-surface of semiconductive layer 5. FIG. 11H shows a further stage where the remaining resist material 3 has been completely removed from the substrate. The resulting structure has conductive regions 22 and 23, corresponding to source and drain electrodes of a transistor, separated by semiconductive region 51.

Figure 12A:
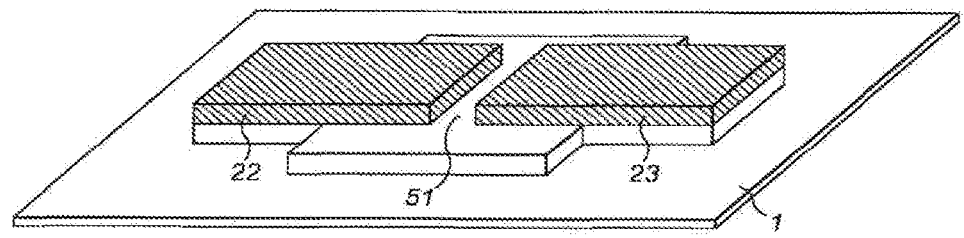
FIGS. 12A, 12B, 12C, 12D, 12E, 12F, and 12G are schematic representations of steps in another method of manufacturing a transistor embodying the invention.
Figure 12B:
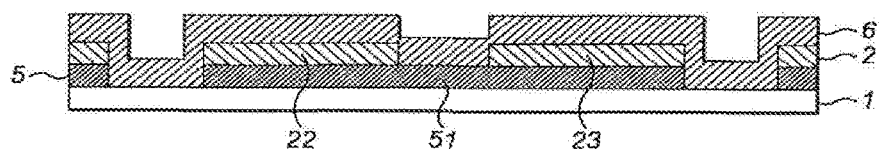
Figure 12C:
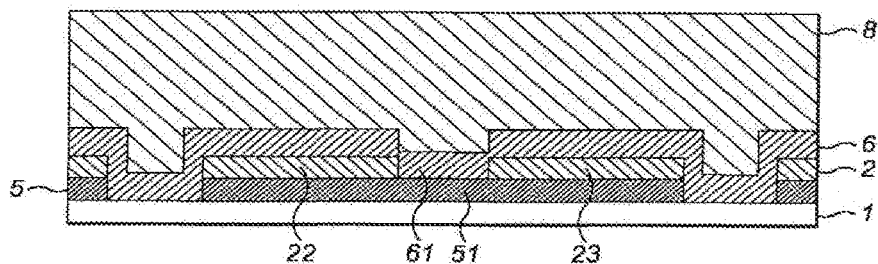
Figure 12C:
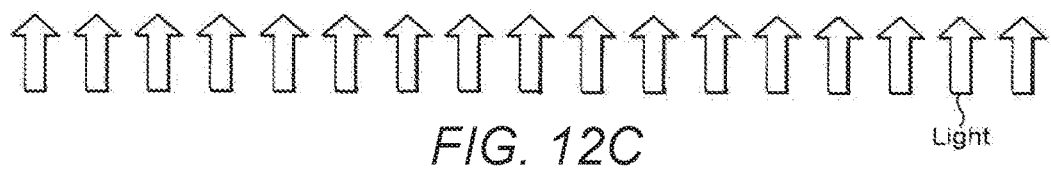
Figure 12D:
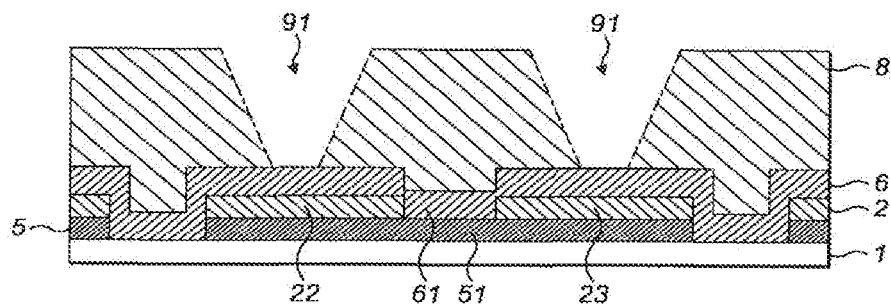
Figure 12E:
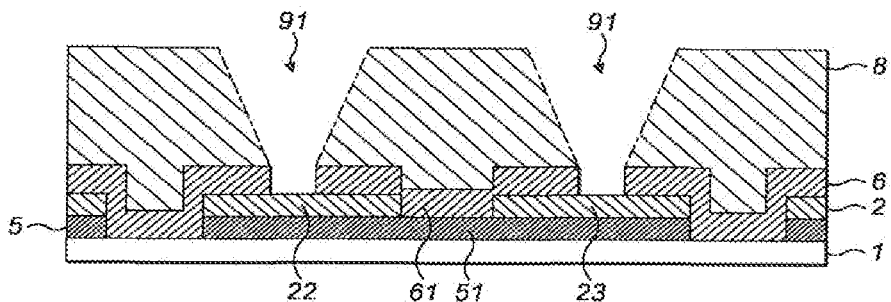
Figure 12F:
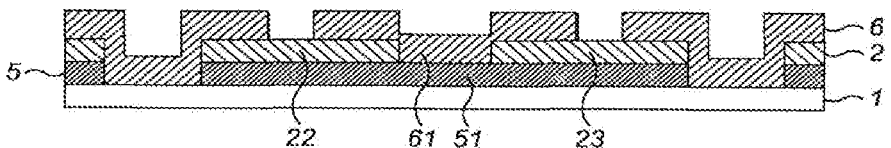
Figure 12G:
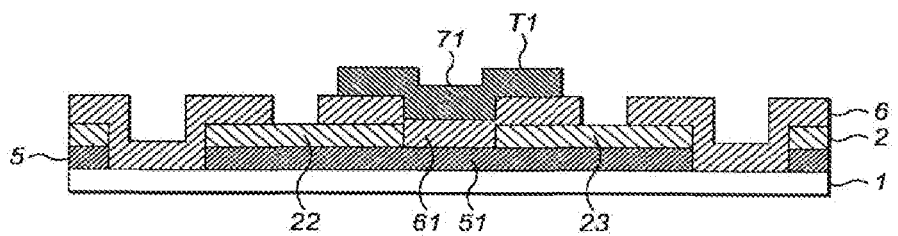

Referring now to FIG. 12A this is a 3D representation of the structure as represented in FIG. 11H. In this instance there is a transparent plastic substrate 1 (PEN), on which is deposited a 30 nm layer of semiconductor 2, gallium:indium:zinc oxide (GaInZnO$_4$) by pulsed-DC sputter deposition, and a 30 nm layer of conductive material 5, molybdenum by DC sputtering. The layers have been patterned according to the steps in FIG. 11. Etching of residual resist material (FIG. 8C) has been accomplished using oxygen plasma (75 sccm, 75 W, 75 mTorr), Exposed molybdenum (FIG. 11D) has been removed using reactive ion-etching (CF$_4$+10% O$_2$, 50 W, 50 mTorr). The then exposed semi-conductive layer 2 (FIG. 11E) has been removed by wet-etching of GIZO (0.05% wt oxalic acid). Further oxygen plasma (FIG. 11F) has removed residual resist material and the then exposed molybdenum removed by a low-energy reactive ion-etching process (CF$_4$+10% O$_2$, 50 W, 300 mTorr). Finally the resist material 3 is completely removed by solvent. Now referring to FIG. 12B a dielectric layer 6, in this instance reactive pulsed-DC sputtering of aluminium oxide (50 nm), has been deposited over the substrate in FIG. 12A providing a largely conformal coating. FIG. 12C shows a further stage where a layer of photoresist 8 has been deposited over the substrate 1 and UV light is provided from beneath substrate 1 to expose photoresist 8. Conductive layer 2 is opaque to UV light such that conductive regions 22 and 23 act to partially shield photoresist 8. In this example, regions 22 and 23 shield first and second regions or portions of the photoresist layer located respectively above them. The resultant structure is shown in FIG. 12D where windows 93 have been created after development of photoresist 8. In other words, the shielded (un-exposed) first and second portions of resist layer have been removed. Windows 93 expose the top-surface of dielectric layer 6. In FIG. 12E these exposed regions of dielectric layer 6 have been removed by etching (in this instance dry-etching using Cl$_2$/BCl$_3$ although suitable wet-etching processes may also be employed). In FIG. 12F the photoresist 8 has been removed leaving patterned regions of dielectric 6, including dielectric region 61 covering semiconductive channel 51. Conductive regions 22 and 23 are partially exposed such that vias or openings have been created to allow subsequent connection to other devices if required. In FIG. 12G a conductive gate region 71 has been provided over the dielectric region 61. This completes a thin-film transistor structure T1. The gate region 71 may be formed by a variety of techniques in different embodiments of the invention. For example, the gate region may be printed. In the present embodiment, however, the gate region has been patterned using the method described in UK priority application 1202544.1. In other words, the gate terminal has been formed using a method suitable for manufacturing an electronic device comprising a first terminal, a second terminal, a semiconductor channel connecting the first and second terminals and through which electrical current may flow between the first and second terminals, a gate terminal to which a potential may be applied to control a conductivity of the semiconductor channel, and a gate dielectric separating the gate terminal and the channel, the method comprising:

providing at least a substrate and said first and second terminals supported, either directly or indirectly, by the substrate, the first and second terminals being separated by a gap;

forming a layer of photoresist material over the substrate so as to cover the first and second terminals, the gap, and regions of the substrate adjacent the gap and the first and second terminals;

forming a mask on a surface of the layer of photoresist material, the mask covering the gap, portions of the first and second terminals adjacent the gap, and portions of the substrate adjacent the gap and adjacent said portions of the first and second terminals;

exposing the resultant structure to electromagnetic radiation from above such that the mask shields a portion of the photoresist layer under the mask from said electromagnetic radiation; removing the mask;

baking the resultant structure;

exposing the resultant structure to electromagnetic radiation from below, such that the first and second terminals shield parts of the previously unexposed portion of photoresist layer from the electromagnetic radiation from below but other parts of the previously unexposed portion of photoresist layer are exposed;

developing the photoresist material to remove photoresist material that was shielded by the mask from the electromagnetic radiation from above but exposed to electromagnetic radiation from below, to form a window in the layer of photoresist material;

depositing at least one of: a layer of semiconductor material; a layer of dielectric material; and a layer of conductor material, at least inside said window, to form at least one of: the semiconductor channel, gate dielectric, and gate terminal, respectively; and removing remaining material of the layer of photoresist material. The step of providing may comprise providing said substrate, a layer of semiconductor material supported by the substrate, said first and second terminals supported directly by the layer of semiconductor material, and a layer of dielectric material covering at least the semiconductor material under said gap, and said depositing may comprise depositing a layer of conductor material, at least inside said window, to form the gate terminal.

Figure 13A:
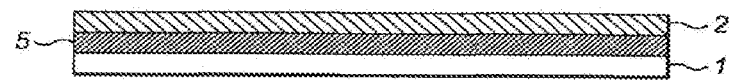
FIGS. 13A, 13B, 13C, 13D, 13E, 13F, 13G, 13H, 13I, 13J, 13K, and 13L are schematic representations of steps in another method of manufacturing a transistor embodying the invention.
Figure 13B:
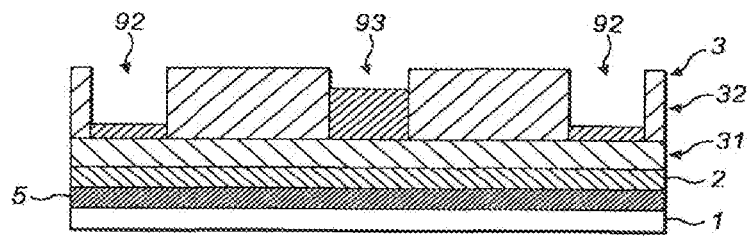
Figure 13C:
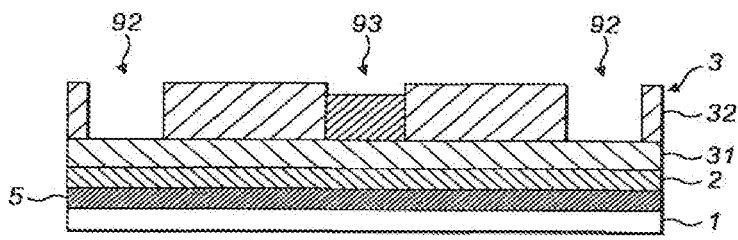
Figure 13D:
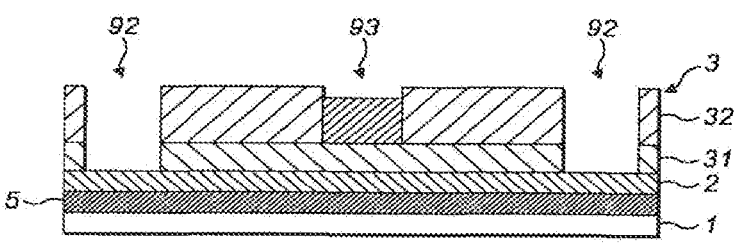
Figure 13E:
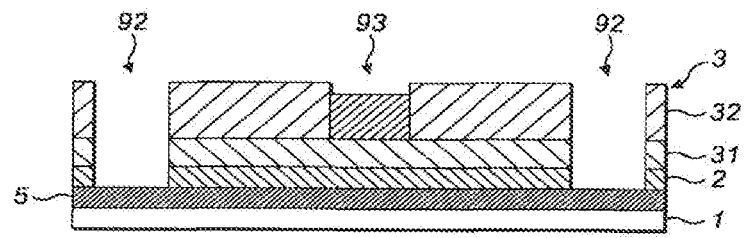
Figure 13F:
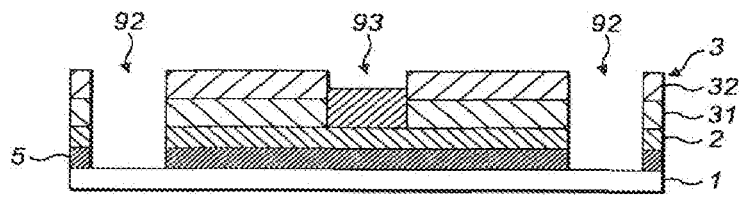
Figure 13G:
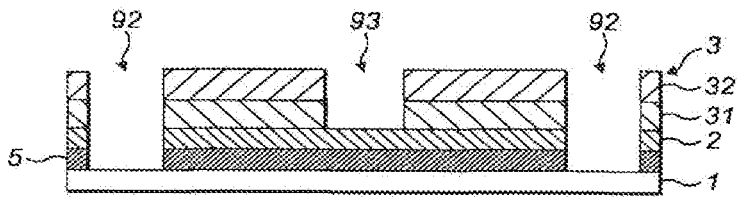
Figure 13H:
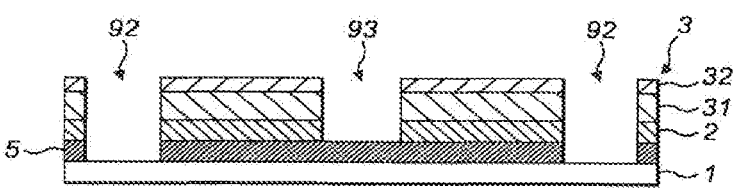
Figure 13I:
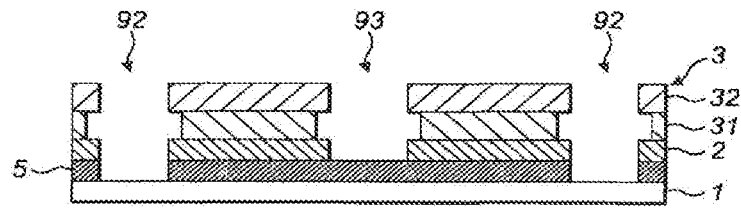
Figure 13J:
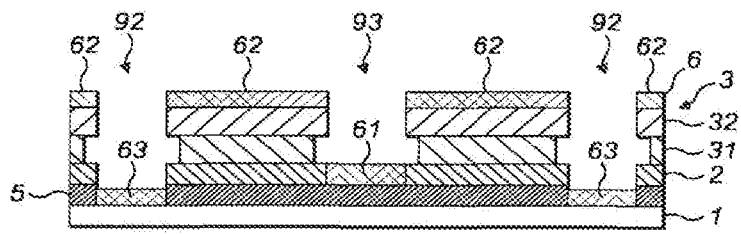
Figure 13K:
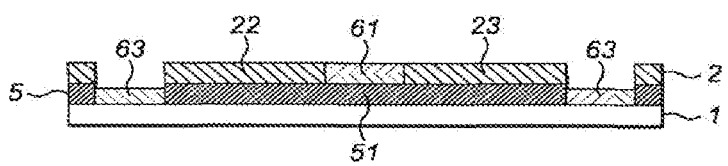
Figure 13L:
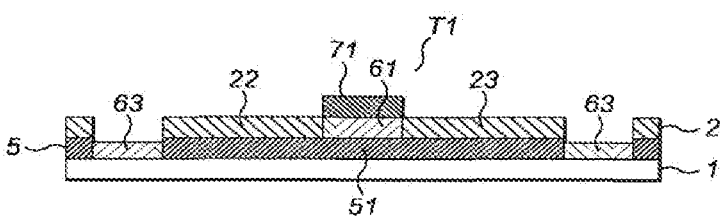

Referring now to FIGS. 13A, 13B, 13C, 13D, 13E, 13F, 13G, 13H, 13I, 13J, 13K, and 13L, this illustrates a schematic representation of steps in another method of manufacturing a transistor embodying the invention. Referring now to FIG. 13A, this is a schematic cross section of a structure undergoing a processing step in a method embodying the invention. The structure comprises a substrate 1 supporting semiconductive layer 5 and conductive layer 2. FIG. 13B shows a stage in the process where a stack of resist materials 3 has been deposited over the substrate, comprising lift-off resist 31 and UV imprint resist 32, and patterned using imprint tool 400 (as depicted in FIGS. 10A, 10B, and 10C). Windows 92 and 93 have been created corresponding to imprint regions 402 and 403, respectively. Within window 92 there is a thin-layer of residual UV imprint resist material 32 covering conductive layer 2. FIG. 13C shows a further stage where the thin-layer of UV imprint resist material 32 within window 92 has been removed by etching, in the same process reducing the overall height of resist stack 3. FIG. 13D shows a further stage where the exposed region of lift-off resist material 31 within window 92 has been removed by etching, in the same process reducing the overall height of resist stack 3. In FIG. 13E, the exposed regions of conductive material 2 have been removed by etching, such that window 92 now exposes regions of semiconductive material 5. Once again the resist stack 3 has been reduced in height during this etch process. In FIG. 13F, these exposed regions of semiconductive material 5 have been removed by etching. FIG. 13G shows a further stage where the residual UV resist material 32 and lift-off resist 31 within window 93 has been removed by etching, further reducing the height of resist stack 3 across the whole substrate. Window 93 now exposes a further region of conductive material 2. In FIG. 13H the conductive material within window 93 has been removed by etching, to expose the top-surface of semiconductive layer 5. FIG. 13I shows a further stage where the lift-off resist material 31 has developed to create an undercut beneath remaining UV resist 32. In other words, undercuts have been formed in walls of the layer of resist material defining the first window 93 and the second window 92. The lower layer 31 has been undercut with respect to the upper layer 31. In FIG. 13J shows a further stage where a layer of dielectric material 6 has been deposited over the substrate. The undercut created by lift-off resist material 31 disrupts the layer of dielectric material into regions 62 covering UV resist layer 32, and regions 61 and 63 covering exposed regions of semiconductive layer 5 and substrate 1 respectively. In FIG. 13K the resist stack 3 has been removed, in the process removing dielectric regions 62. The resulting structure has conductive regions 22 and 23, corresponding to source and drain electrodes of a transistor, separated by semiconductive region 51. In FIG. 13L a conductive gate region 71 has been provided over the dielectric region 61 to complete a thin-film transistor structure T1. The gate region 71 may again be formed by a variety of techniques in different embodiments, for example by printing, but in this particular embodiment has been patterned using the method described in UK priority application 1202544.1, as described above.

In certain embodiments the etch selectivity is 1:1 and the resist lateral etch is much slower than the vertical etch. In certain embodiments, a 30 nanometre thick layer of Mo and a 20 nanometre layer of GIZO are employed. The Mo etch can be achieved using $CF_4/O_2$ or other fluorine-based etchants (or a wet-etch may be used such as Transene™ Moly Etch TFM). The GIZO etch can be achieved using $BCl_3/Cl_2$ (or a wet-etch may be used with oxalic acid). In certain embodiments, the method may utilise lamp or laser annealing to repair surface damage on the semiconductor. In certain embodiments thermal annealing may be employed (e.g. at 150 deg C. in air) after certain steps in the fabrication process, for example to repair or remove surface damage caused by plasma processing.

It will be appreciated that the above-described methods may be used to manufacture one or a plurality of transistors on a common substrate, and contacts to and interconnections between these transistors may be formed using suitable techniques, for example by imprinting or photolithographic techniques employing a third mask for example.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

It will be also be appreciated that, throughout the description and claims of this specification, language in the general form of "X for Y" (where Y is some action, activity or step) and X is some means for carrying out that action, activity or step) encompasses means X adapted or arranged specifically, but not exclusively, to do Y.

The invention claimed is:

1. A method of manufacturing a transistor, the method comprising:

providing a substrate, a region of semiconductive material supported by the substrate, and a region of electrically conductive material supported by the region of semiconductive material;

forming at least one layer of resist material over said regions and directly over the region of electrically conductive material, such that a bottom surface of the at least one layer of resist material is in direct contact with a top surface of the region of electrically conductive material, to form a covering of resist material over said regions;

forming a depression in a surface of the covering of resist material, said depression extending over a first portion of said region of electrically conductive material, said first portion separating a second portion of the region of electrically conductive material from a third portion of the region of electrically conductive material;

removing resist material located under said depression so as to form a first window, through said covering of resist material, exposing said first portion of the region of electrically conductive material;

removing said first portion of the region of electrically conductive material to expose a connecting portion of the region of semiconductive material, said connecting portion connecting the second portion of the region of electrically conductive material to the third portion of the region of electrically conductive material;

forming a layer of dielectric material over the exposed connecting portion of the region of semiconductive material; and depositing electrically conductive material to form a layer of electrically conductive material over said layer of dielectric material, the layer of dielectric material electrically isolating the layer of electrically conductive material from the second and third portions of the region of electrically conductive material, whereby said second and third portions of the region of electrically conductive material provide a source terminal and a drain terminal, respectively, and whereby the layer of electrically conductive material provides a gate terminal to which a potential may be applied to control a conductivity of the connecting portion of the region of semiconductive material connecting the second and third portions of the region of electrically conductive material.

2. The method of claim 1, wherein said forming at least one layer of resist material comprises forming a first layer of a first resist material over said regions and directly over the region of electrically conductive material, and forming a second layer of a second resist material over the first layer.

3. The method of claim 2, wherein said first resist material is a lift-off resist material.

4. The method of claim 2, wherein said second resist material is an imprintable resist material.

5. The method of claim 4, wherein forming said depression in a surface of the covering of resist material comprises forming said depression by imprinting using an imprinting tool, and wherein said surface of the covering of resist material is a surface of the second layer of resist material.

6. The method of claim 5, wherein forming said depression in a surface of the covering of resist material is performed at the same time as forming the second layer of the second resist material.

7. The method of claim 5, wherein forming said depression in a surface of the covering of resist material is performed after forming the second layer of the second resist material.

8. The method of claim 1, wherein forming the layer of dielectric material over the exposed connecting portion of the region of semiconductive material comprises depositing dielectric material at least inside the first window to form the layer of dielectric material, and wherein the method further comprises:
 removing resist material at least from around said first window so as to expose the second and third portions of the region of electrically conductive material.

9. The method of claim 8, further comprising undercutting the covering of resist material around the first window before said depositing of dielectric material so as to expose a part of an upper surface of the second portion of the region of electrically conductive material adjacent the connecting portion and to expose a part of an upper surface of the third portion of the region of electrically conductive material adjacent the connecting portion of the region of semiconductive material.

10. The method of claim 9, wherein said depositing of dielectric material is arranged such that the layer of dielectric material at least partly covers the exposed part of the upper surface of the second portion of the region of electrically conductive material and the exposed part of the upper surface of the third portion of the region of electrically conductive material.

11. The method of claim 9, wherein said forming at least one layer of resist material over said regions to form the covering of resist material over said regions comprises forming a first layer of a first resist material over said regions and forming a second layer of a second resist material over the first layer, and wherein undercutting the covering of resist material comprises forming at least one undercut in the first layer.

12. The method of claim 9, further comprising removing resist material to widen said first window after said undercutting but before said depositing of dielectric material.

13. The method of claim 9, further comprising removing resist material to widen said first window at the same time as said undercutting.

14. The method of claim 1, wherein one or more additional transistors are manufactured on the substrate to form an electronic circuit comprising an array of a plurality of transistors on the substrate, the method further comprising:
 forming a covering of dielectric material over the array of transistors;
 forming a plurality of windows in the covering of dielectric material, each window exposing at least a portion of a terminal of a respective transistor; and
 selectively forming interconnections between said exposed portions of terminals.

15. The method of claim 14, wherein selectively forming interconnections between said exposed portions of terminals comprises printing conductive material.

16. The method of claim 1, further comprising:
 forming a covering of dielectric material over the transistor;
 forming a window in the covering of dielectric material, the window exposing the gate terminal of the transistor; and
 selectively forming an interconnection between the gate terminal and another portion of conductive material supported by the substrate.

* * * * *

UNITED STATES PATENT AND TRADEMARK OFFICE
CERTIFICATE OF CORRECTION

PATENT NO. : 10,672,765 B2
APPLICATION NO. : 15/236057
DATED : June 2, 2020
INVENTOR(S) : Price et al.

Page 1 of 1

It is certified that error appears in the above-identified patent and that said Letters Patent is hereby corrected as shown below:

In the Specification

Column 21, Line 43: Please correct "FIG. 120" to read -- FIG. 12D --

Signed and Sealed this
Sixth Day of October, 2020

Andrei Iancu
*Director of the United States Patent and Trademark Office*